(12) United States Patent
Lin et al.

(10) Patent No.: US 11,430,832 B2
(45) Date of Patent: Aug. 30, 2022

(54) SEMICONDUCTOR MRAM DEVICE AND METHOD

(71) Applicant: Taiwan Semiconductor Manufacturing Company, Ltd., Hsinchu (TW)

(72) Inventors: Shy-Jay Lin, Jhudong Township (TW); MingYuan Song, Hsinchu (TW); Hiroki Noguchi, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 70 days.

(21) Appl. No.: 16/668,576

(22) Filed: Oct. 30, 2019

(65) Prior Publication Data

US 2021/0134882 A1 May 6, 2021

(51) Int. Cl.
| | |
|---|---|
| *H01L 43/08* | (2006.01) |
| *H01L 29/66* | (2006.01) |
| *H01L 29/78* | (2006.01) |
| *H01L 27/22* | (2006.01) |
| *H01L 43/12* | (2006.01) |
| *H01L 43/02* | (2006.01) |

(52) U.S. Cl.
CPC ........ *H01L 27/228* (2013.01); *H01L 29/7851* (2013.01); *H01L 43/02* (2013.01); *H01L 43/12* (2013.01)

(58) Field of Classification Search
CPC ..... H01L 43/12; H01L 43/02; H01L 29/7851; H01L 27/222; H01L 27/228; H01L 43/08; H01L 29/6681; H01L 29/785; H01L 27/226
See application file for complete search history.

(56) References Cited

U.S. PATENT DOCUMENTS

| | | | |
|---|---|---|---|
| 10,411,069 B1 | 9/2019 | Jacob et al. | |
| 2005/0205931 A1* | 9/2005 | Mouli | H01L 21/84 257/347 |
| 2014/0264670 A1* | 9/2014 | Annunziata | H01L 43/12 257/421 |

(Continued)

FOREIGN PATENT DOCUMENTS

| | | |
|---|---|---|
| DE | 102016117034 A1 | 7/2017 |
| JP | 2013069865 A | 4/2013 |

(Continued)

*Primary Examiner* — Shahed Ahmed
*Assistant Examiner* — Khatib A Rahman
(74) *Attorney, Agent, or Firm* — Slater Matsil, LLP

(57) ABSTRACT

A method includes depositing a first dielectric layer over a semiconductor substrate, depositing a first electrode layer over the first dielectric layer, etching the first electrode layer to form a first electrode and a second electrode laterally separated from the first electrode, depositing a Spin Orbit Torque (SOT) material on the first electrode and the second electrode, depositing Magnetic Tunnel Junction (MTJ) layers on the SOT material, depositing a second electrode layer on the MTJ layers, etching the SOT material to form a SOT layer extending from the first electrode to the second electrode, etching the MTJ layers to form an MTJ stack on the SOT layer, and etching the second electrode layer to form a top electrode on the MTJ stack.

20 Claims, 25 Drawing Sheets

(56) References Cited

U.S. PATENT DOCUMENTS

| | | | |
|---|---|---|---|
| 2015/0035032 A1 | 2/2015 | Kang et al. | |
| 2016/0225423 A1* | 8/2016 | Naik | H01L 27/228 |
| 2017/0194557 A1 | 7/2017 | Chuang et al. | |
| 2018/0180686 A1* | 6/2018 | Ferreira | H01F 10/3272 |
| 2018/0248110 A1 | 8/2018 | Kardasz et al. | |
| 2018/0277746 A1* | 9/2018 | Abe | G11C 11/161 |
| 2019/0066746 A1* | 2/2019 | Li | H01F 10/3295 |
| 2020/0105998 A1* | 4/2020 | Smith | G11C 11/1675 |
| 2020/0135804 A1* | 4/2020 | Luo | G11C 11/1675 |
| 2020/0185598 A1* | 6/2020 | Noh | H01L 43/10 |
| 2020/0227105 A1* | 7/2020 | Gosavi | H01L 43/08 |
| 2020/0365308 A1* | 11/2020 | Lin | H01L 43/10 |
| 2021/0036054 A1* | 2/2021 | Gallagher | H01L 43/08 |
| 2021/0066580 A1* | 3/2021 | Song | H01L 43/12 |
| 2021/0134882 A1* | 5/2021 | Lin | H01L 43/08 |
| 2021/0202827 A1* | 7/2021 | Song | H01L 43/02 |

FOREIGN PATENT DOCUMENTS

| | | |
|---|---|---|
| JP | 2018517225 A | 6/2018 |
| JP | 2018157171 A | 10/2018 |
| KR | 20150016797 A | 2/2015 |
| KR | 20180026725 A | 3/2018 |
| WO | 2016198420 A1 | 12/2016 |

* cited by examiner

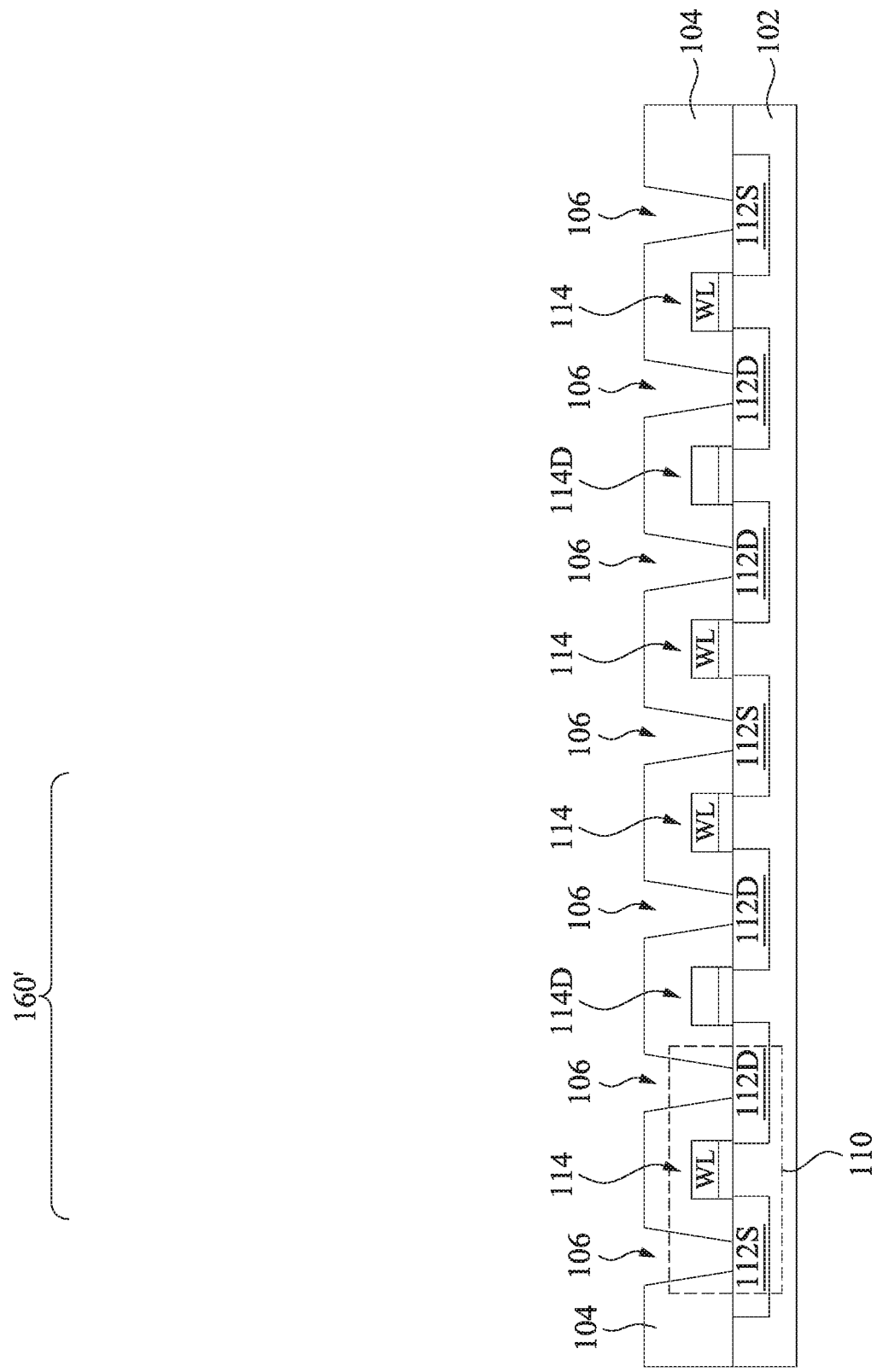

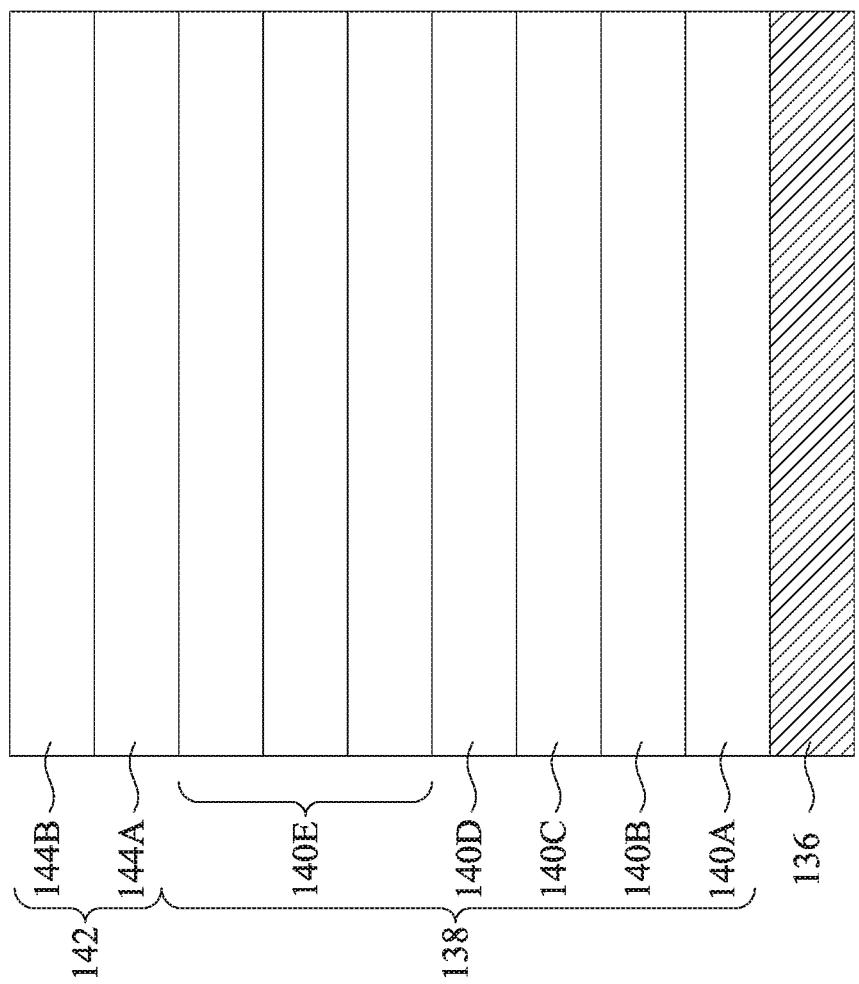

SEMICONDUCTOR MRAM DEVICE AND METHOD

BACKGROUND

Semiconductor memories are used in integrated circuits for electronic applications, including cell phones and personal computing devices, as examples. One type of semiconductor memory device is Magneto-Resistive Random Access Memory (MRAM), which involves spin electronics that combines semiconductor technology and magnetic materials and devices. The spins of electrons, through their magnetic moments, rather than the charge of the electrons, are used to store bit values.

Conventional MRAM cells are Spin-Transfer Torque (STT) MRAM cells. A typical STT-MRAM cell may include a Magnetic Tunnel Junction (MTJ) stack, which includes a pinning layer, a pinned layer over the pinning layer, a tunnel layer over the pinned layer, and a free layer over the tunnel layer. During the formation of the MRAM cell, multiple blanket layers are deposited first. The blanket layers are then patterned through a photolithography and etching process to form the MTJ stack.

The STT-MRAM cells suffer from reliability problem due to the fact that programming currents have to pass through the tunnel layer, hence degrade or damage the tunnel layer. Accordingly, Spin Orbit Torque (SOT) MRAM was developed. In the programming of the SOT-MRAM cells, the programming current does not pass through the tunnel layer, and thus the reliability of the SOT-MRAM is improved over the STT-MRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 2A, 2B, 3, 4A, 4B, 5, 6, 7, 8, 9, 10A, 10B, 11A, 11B, 12, 13A, 13B, and 14 illustrate the cross-sectional views and plan views of intermediate stages in the formation of a Spin Orbit Torque (SOT) Magneto-Resistive Random Access Memory (MRAM) device, in accordance with some embodiments.

DETAILED DESCRIPTION

Figure 1A:
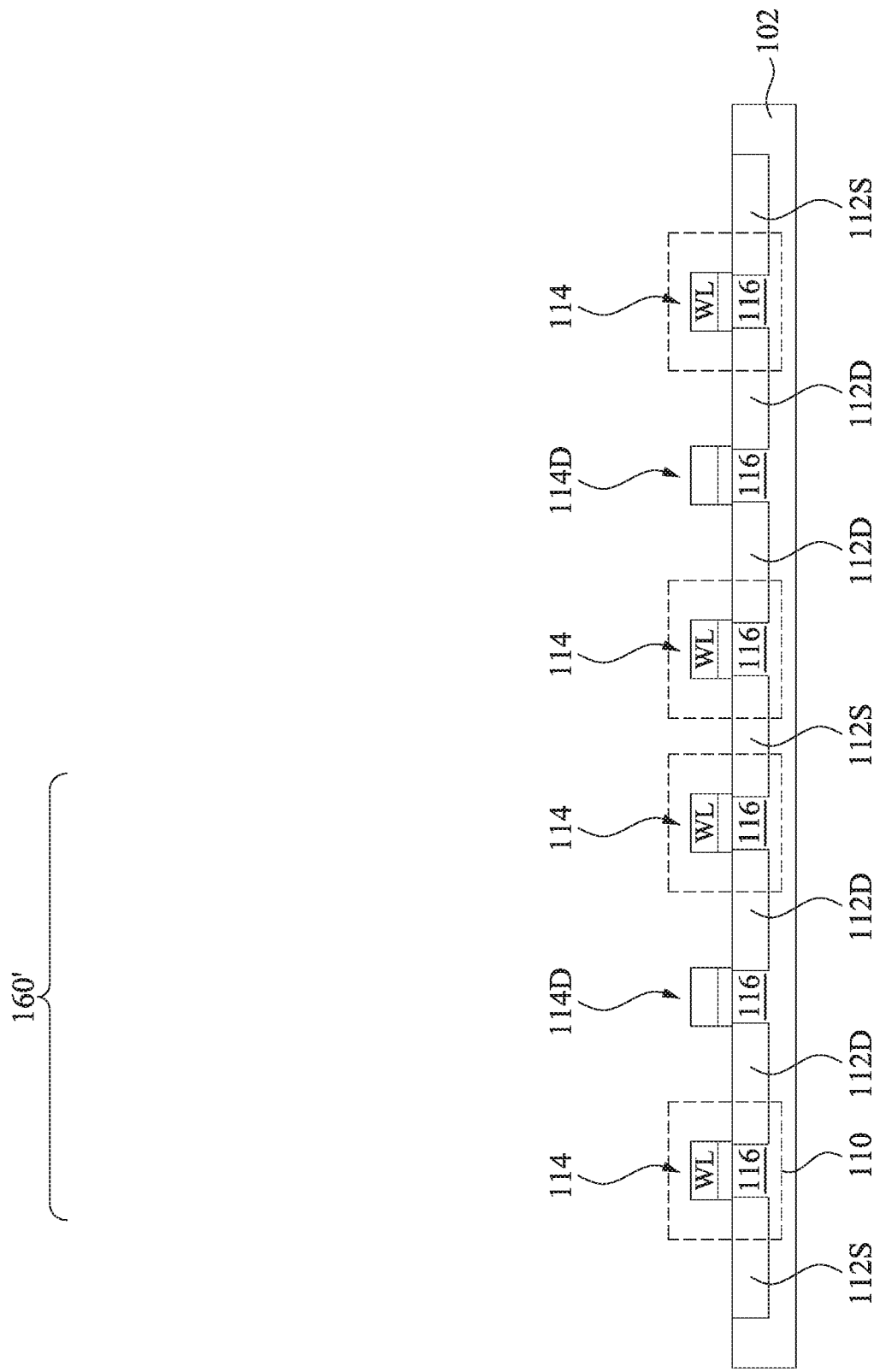

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Spin Orbit Torque (SOT) Magneto-Resistive Random Access Memory (MRAM) cell and the method of forming the same are provided in accordance with various embodiments. The intermediate stages in the formation of the SOT MRAM cell are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, an SOT-MRAM cell includes an SOT layer formed beneath an MTJ stack. The SOT layer is coupled to two transistors, and the MTJ stack is coupled to a Reading Bit Line. By forming a cell in this manner, the size of the cell may be reduced and the amount of routing within a cell may be reduced. This can improve the speed and the power efficiency of a SOT-MRAM device, while also decreasing the size of the SOT-MRAM device. Additionally, the number of process steps to form a cell may be reduced by forming a cell as described herein.

Figure 1B:
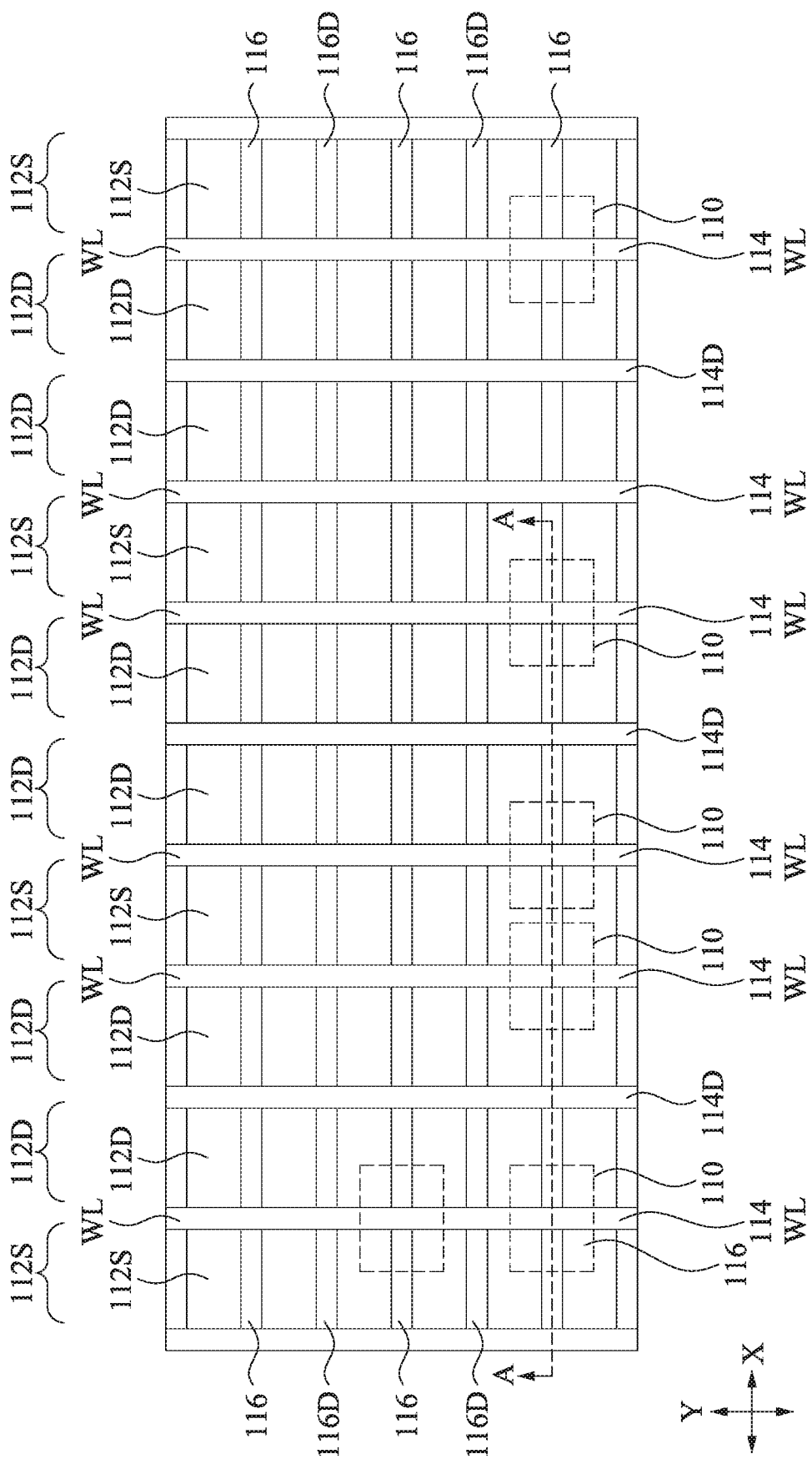
Figure 13A:
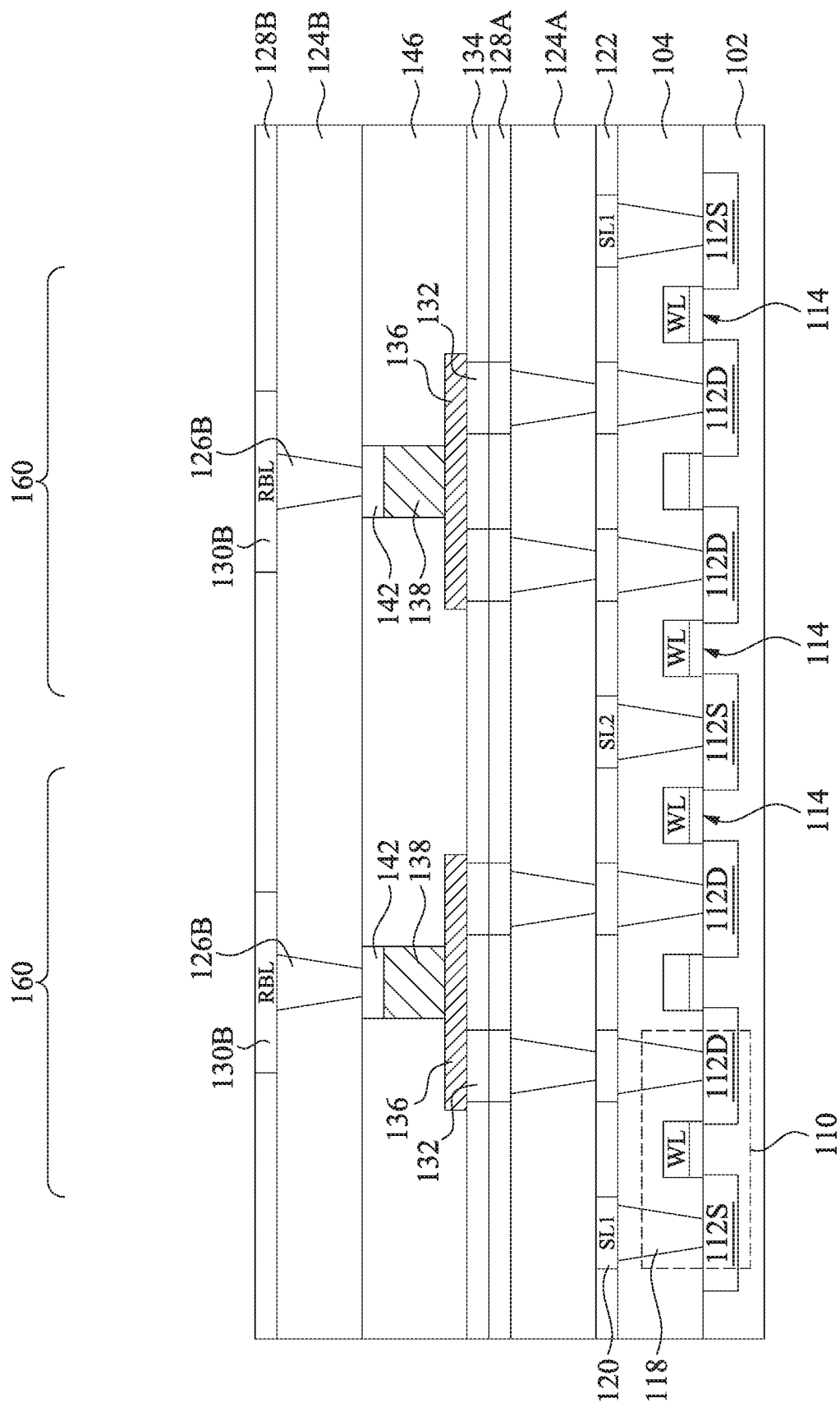
Figure 13B:
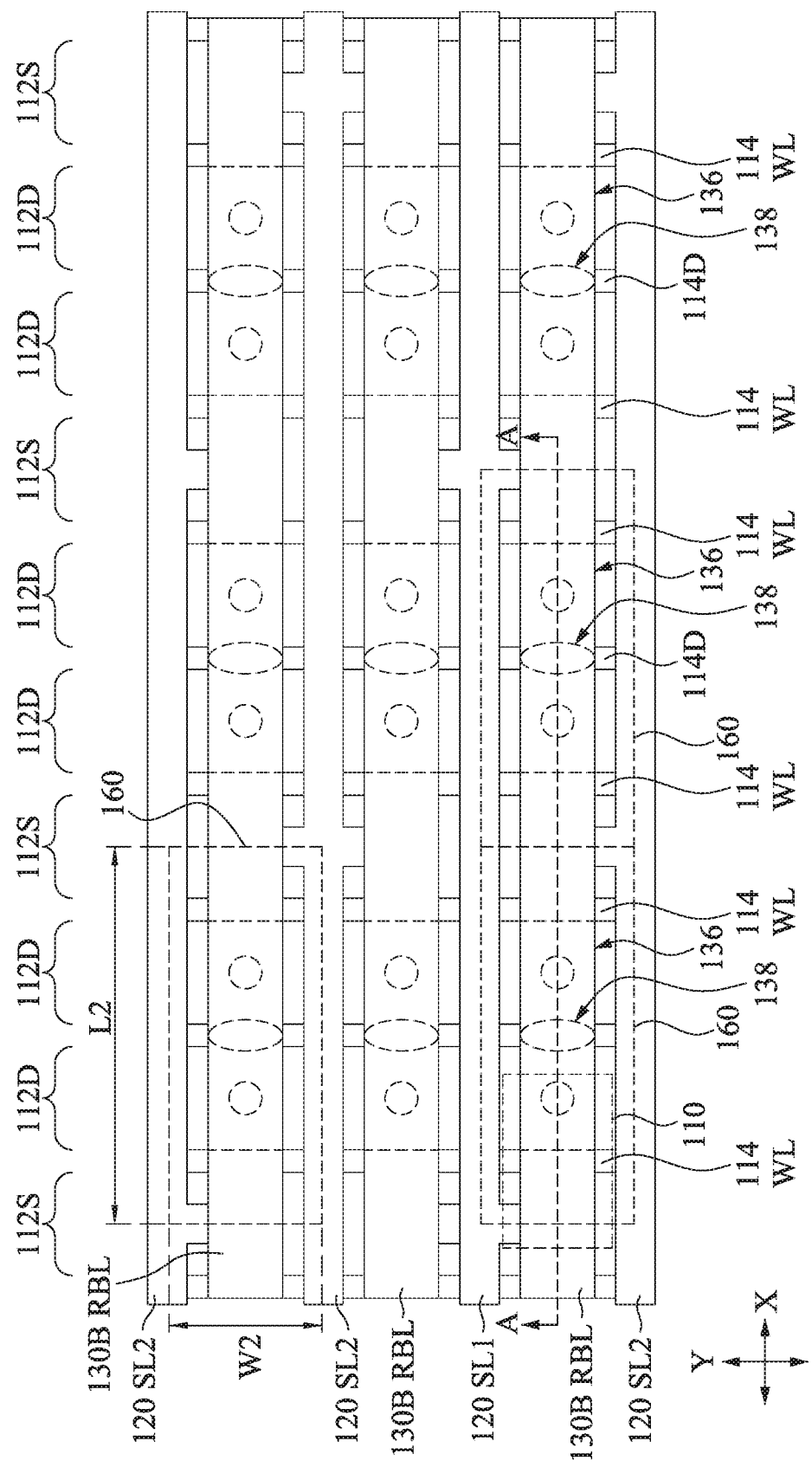
Figure 14:
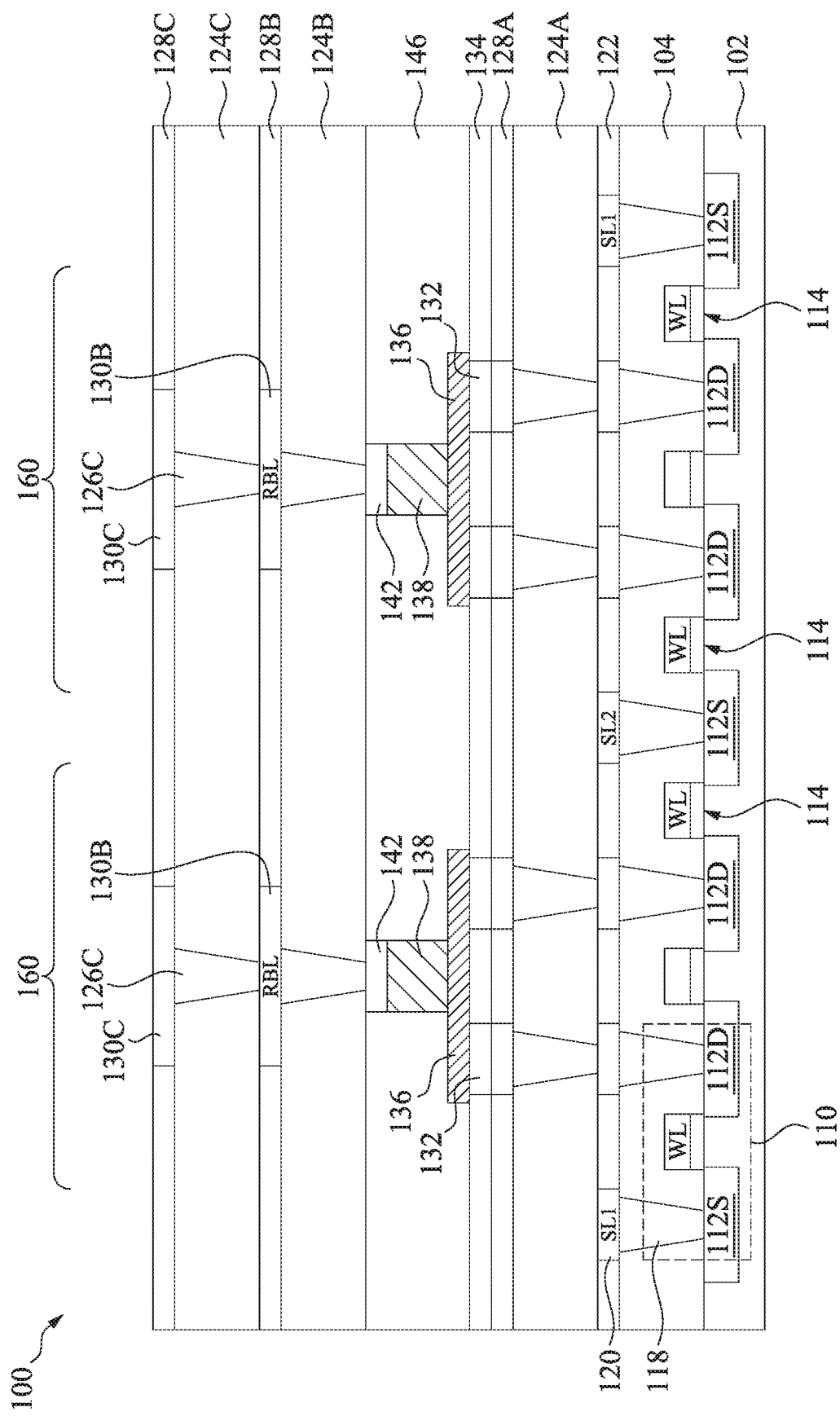

FIGS. 1A-1B through 14 illustrate the cross-sectional views and plan views of intermediate stages in the formation of a SOT-MRAM device 100 (see e.g., FIG. 14), in accordance with some embodiments. The cross-sectional view shown in FIGS. 1A, 2A, 4A, 10A, 11A, and 13A correspond to a cross-section of the plan view shown in FIGS. 1B, 2B, 4B, 10B, 11B, and 13B, such as example the cross-section A-A labeled in FIG. 1B. The SOT-MRAM device 100 includes multiple cells 160 arranged in an array within the SOT-MRAM device 100. Each cell 160 of the SOT-MRAM device 100 acts as a memory that stores a single bit, which may be read or written. In FIGS. 1A, 1B, 2A, 2B, 4A, 4B, 10A, 10B, 11A, and 11B, an example region in which a cell 160 is subsequently formed is labeled as region 160'. In some embodiments, each cell 160 includes a SOT-MRAM structure 150 (see FIGS. 8 through 11A-11B) coupled to two transistors 110, which may be, for example, FinFETs.

FIGS. 1A and 1B show a cross-sectional view and a plan view of a substrate 102 and multiple transistors 110 formed on the substrate 102, in accordance with some embodiments. The transistors no are part of the subsequently formed cells 160 of the SOT-MRAM device 100. Some example transistors no are indicated in FIGS. 1A and 1B. The substrate 102 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including silicon germanium (SiGe), GaAsP, AlInAs, AlGaAs, GaInAs, GaInP, and/or GaInAsP; or combinations thereof. Other substrates, such as multi-layered or gradient substrates, may also be used.

In some embodiments, the transistors 110 are Fin Field-Effect Transistors (FinFETs) comprising fins 116, gate structures 114, and source regions 112S and drain regions 112D. As shown in FIGS. 1A and 1B, the fins 116 are formed on the substrate 102 and may comprise the same material as the substrate 102 or a different material. In some embodiments, dummy fins 116D may be formed between some fins 116 to improve process uniformity. The gate structures 114 are formed over multiple fins 116 and extend in a direction perpendicular to the fins 116. In some embodiments, spacers (not shown in the figures) may be disposed on the sidewalls of the gate structures 114. In some embodiments, dummy gate structures 114D may be formed between some gate structures 114 to improve process uniformity. The dummy gate structures 114D may be considered "dummy transistors" or "dummy FinFETs," in some embodiments. Some gate structures 114 are used as Word Lines in the SOT-MRAM device 100 (described in greater detail below), and have been labeled as "WL" accordingly. The source regions 112S and the drain regions 112D are formed in the fins 116 on either side of the gate structures 114. The source regions 112S and the drain regions 112D may be, for example, implanted regions of the fins 116 or epitaxial material grown in recesses formed in the fins 116. In the embodiment shown in FIG. 1A-1B, one side of each fin 116 is adjacent source regions 112S and the other side of each fin 116 is adjacent drain regions 112D.

The transistors 110 shown in the figures are representative, and some features of the transistors 110 may have been omitted from the figures for clarity. In other embodiments, the arrangement, configuration, sizes, or shapes of features such as fins 116, dummy fins 116D, gate structures 114, dummy gate structures 114D, source regions 112S, drain regions 112D, or other features may be different than shown. In other embodiments, the transistors 110 may be another type of transistor, such as planar transistors.

Figure 2B:
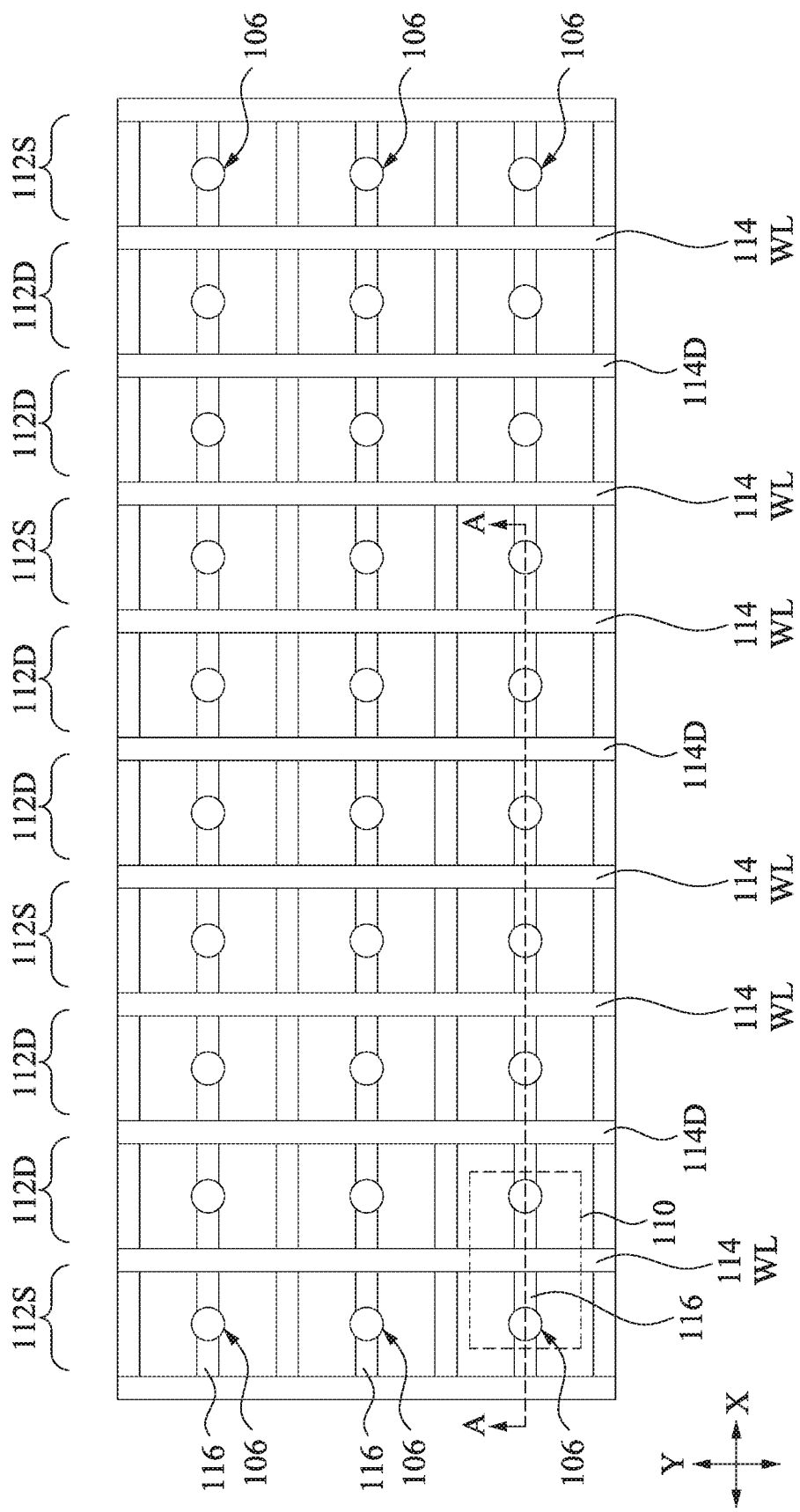

In FIGS. 2A-2B, a dielectric layer 104 is formed over the substrate 102 and patterned to expose the source regions 112S and drain regions 112D, in accordance with some embodiments. The dielectric layer 104 may cover the transistors 110, and may be considered an Inter-Layer Dielectric layer (ILD) in some embodiments. The dielectric layer 104 may be formed of any suitable dielectric material including, for example, a nitride such as silicon nitride, an oxide such as silicon oxide, phosphosilicate glass (PSG), borosilicate glass (BSG), boron-doped phosphosilicate glass (BPSG), the like, or combinations thereof. The dielectric layer 104 may be formed using any acceptable deposition process, such as spin coating, physical vapor deposition (PVD), chemical vapor deposition (CVD), the like, or a combination thereof. In some embodiments, the dielectric layer 104 may be a low-k dielectric material, such as a dielectric material having a dielectric constant (k value) lower than about 3.0, for example.

Figure 3:
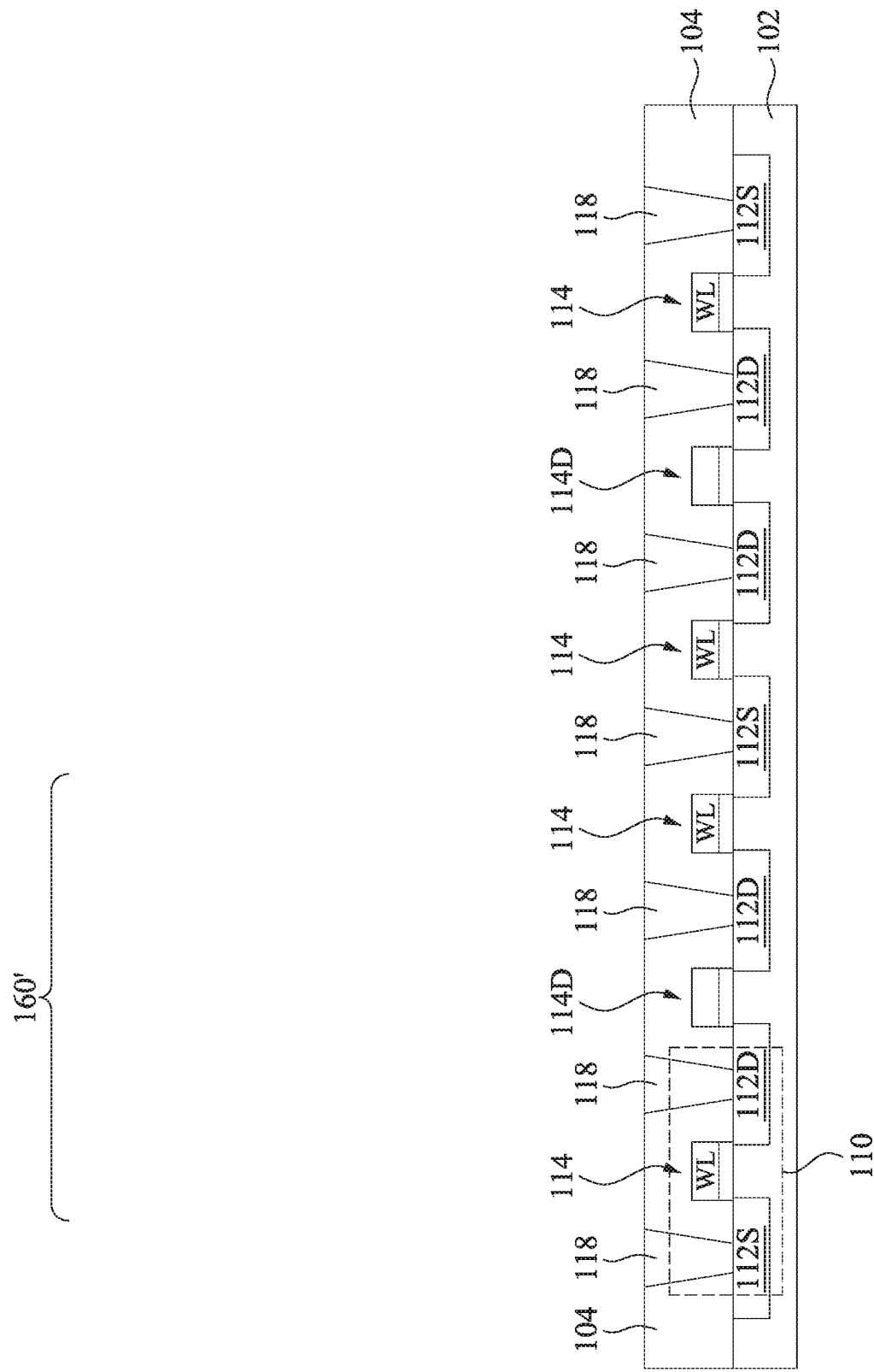

The dielectric layer 104 may be patterned to form openings 106 that expose the source regions 112S and the drain regions 112D for subsequent formation of contact plugs 118 (see FIG. 3). The dielectric layer 104 may be patterned using a suitable photolithography and etching process. For example, a photoresist structure (not shown) may be formed over the dielectric layer 104 and patterned. The openings 106 may be formed by etching the dielectric layer 104 using the patterned photoresist structure as an etching mask. The dielectric layer 104 may be etching using a suitable anisotropic etching process, such as a wet etching process or a dry etching process.

Turning to FIG. 3, contact plugs 118 are formed to make electrical connection to the source regions 112S and the drain regions 112D, in accordance with some embodiments. In some embodiments, the contact plugs 118 are formed by depositing a blanket barrier layer (not individually shown) extending into the openings 106, depositing a conductive material over the blanket barrier layer, and performing a planarization process such as a Chemical Mechanical Polish (CMP) process or a grinding process to remove excess portions of the blanket barrier layer and the conductive material. In some embodiments, the barrier layer may be formed of one or more layers of titanium, titanium nitride, tantalum, tantalum nitride, tungsten nitride, ruthenium, rhodium, platinum, other noble metals, other refractory metals, their nitrides, combinations of these, or the like. The conductive material of the contact plugs 118 may be a metal material such as copper, aluminum, tungsten, cobalt, alloys thereof, the like, or combinations thereof. The barrier layer or the conductive material of the contact plugs 118 may be formed using a suitable process such as Chemical Vapor Deposition (CVD), Physical Vapor Deposition (PVD), Atomic Layer Deposition (ALD), plating, or the like.

Figure 4A:
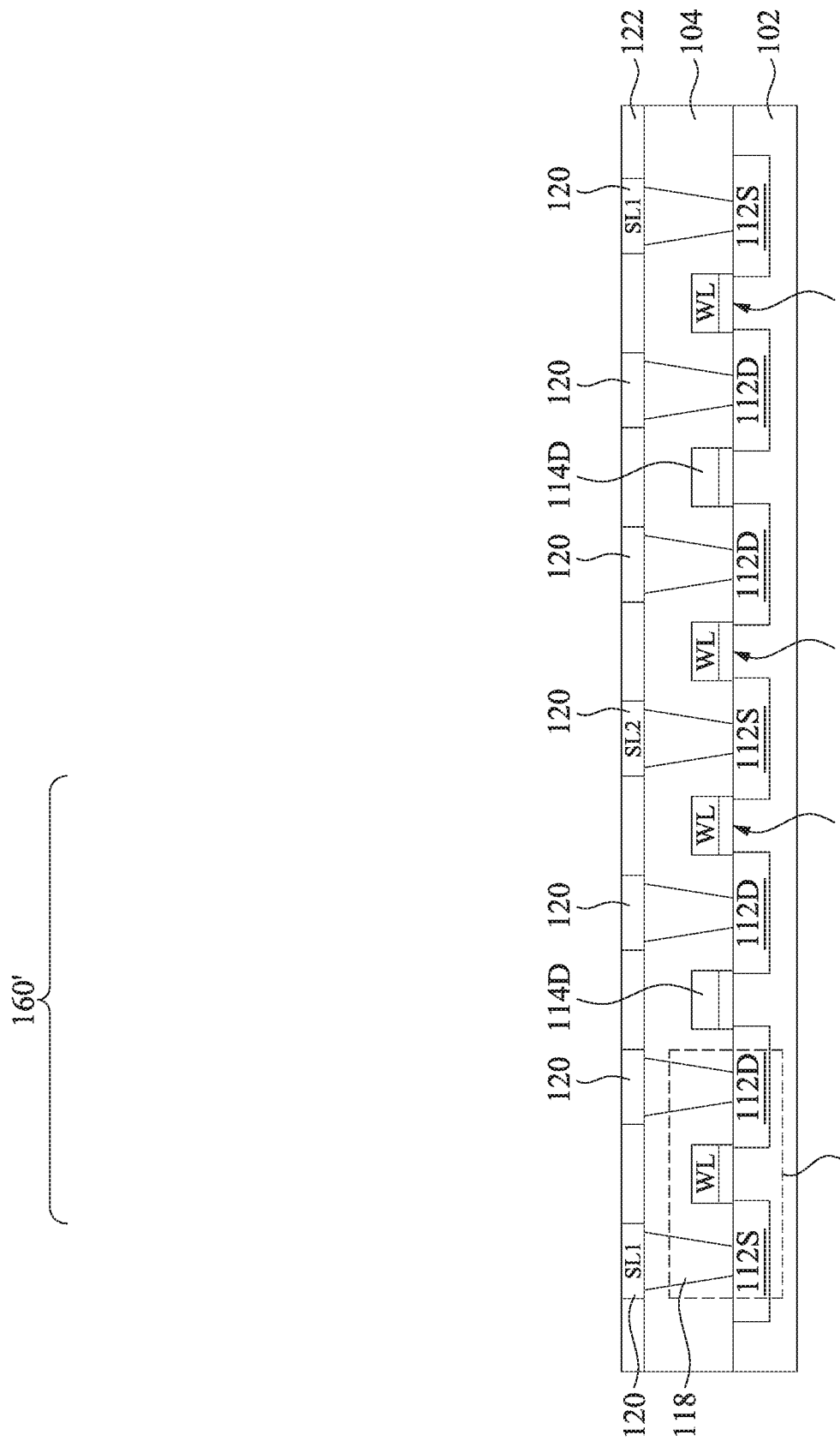
Figure 4B:
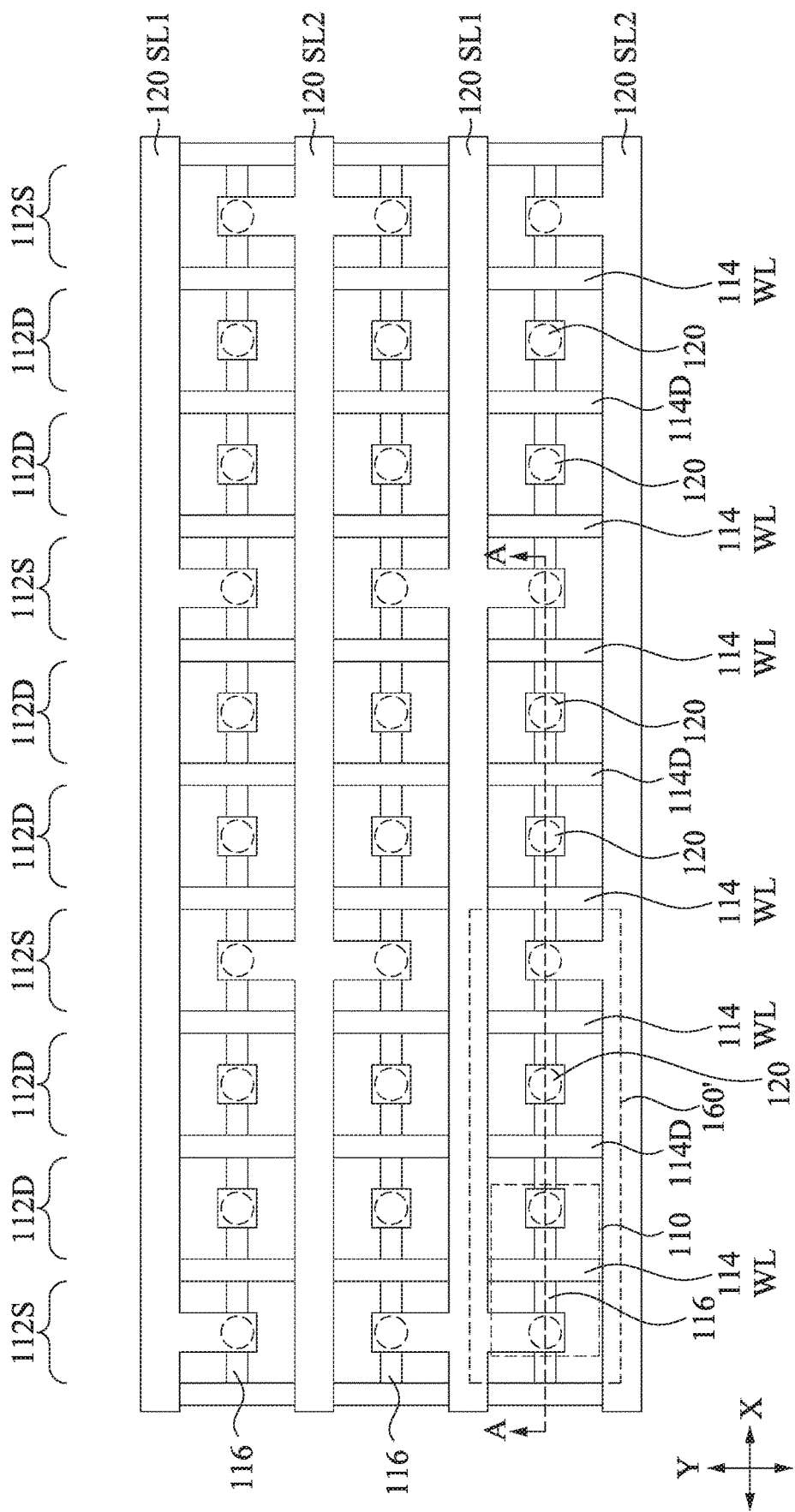

Turning to FIGS. 4A-4B, conductive lines 120 are formed to electrically connect the contact plugs 118 and provide electrical routing within the SOT-MRAM device 100. The conductive lines 120 may be formed within a dielectric layer 122 that is formed over the dielectric layer 104. The dielectric layer 122 may be a material similar to those described above for dielectric layer 104 (see FIGS. 2A-2B), and may be deposited using similar techniques as dielectric layer 104. The dielectric layer 122 may be considered an Inter-Metal Dielectric layer (IMD) in some embodiments.

The conductive lines 120 may be formed using a suitable technique such as damascene, dual-damascene, plating, deposition, the like, or combinations thereof. In some embodiments, the conductive lines 120 are formed by first depositing the dielectric layer 122 and patterning the dielectric layer 122 to form openings (e.g., using a suitable photolithography and etching process), and then filling the openings in the dielectric layer 122 with conductive material. For example, the conductive lines 120 may be formed by depositing an optional blanket barrier layer (not individually shown) over the patterned dielectric layer 122, depositing a conductive material over the blanket barrier layer, and performing a planarization process such as a CMP process or a grinding process to remove excess portions of the blanket barrier layer and the conductive material. The barrier layer or the conductive material may be similar to those described above for the contact plugs 118 (see FIG. 3), and may be deposited using similar techniques. In some embodiments, the conductive material of the contact plugs 118 and the conductive lines 120 may be deposited in the same step, for example, if a dual-damascene process is used to form the contact plugs 118 and the conductive lines 120.

In some embodiments, the conductive lines 120 are formed by first depositing the optional blanket barrier layer over the dielectric layer 104 and contact plugs 118, depositing a conductive material over the blanket barrier layer, and then patterning the barrier layer and conductive material (e.g., using a suitable photolithography and etching process) to form the conductive lines 120. The dielectric layer 122 may be deposited over the conductive lines 120 and a planarization process performed to expose the conductive lines 120.

In some embodiments, some contact plugs 118 are electrically connected to each other by the conductive lines 120, as shown in FIG. 4B. In some embodiments, portions of conductive lines 120 are used as a first Source Line ("SL1 conductive line 120") or a second Source Line ("SL2 conductive line 120") in the SOT-MRAM device 100 (described in greater detail below), and have been labeled as "SL1" or "SL2" accordingly. Some contact plugs 118 are connected by SL1 conductive lines 120 and other contact plugs 118 are connected by SL2 conductive lines 120. In some embodiments, each cell 160 of the SOT-MRAM device 100 includes a SL1 conductive line 120 connected to a source region 112S of a first transistor 110 and a SL2 conductive line 120 connected to a source region 112S of a second transistor 110. In some embodiments, each source region 112S of the SOT-MRAM device 100 is connected to either a SL1 conductive line 120 or a SL2 conductive line 120. The pattern of the conductive lines 120 within the SOT-MRAM device 100 may also be different than shown, and the SOT-MRAM device 100 may have additional layers of electrical routing (e.g., conductive lines and vias) between the contact plugs 118 and the conductive lines 120 (described in greater detail below with respect to FIG. 6). In some embodiments, the first Source Lines or the second Source Lines of the SOT-MRAM device 100 may be connected to the transistors 110 using a different configuration of conductive lines than shown, which may include electrical routing formed on different layers.

Figure 5:
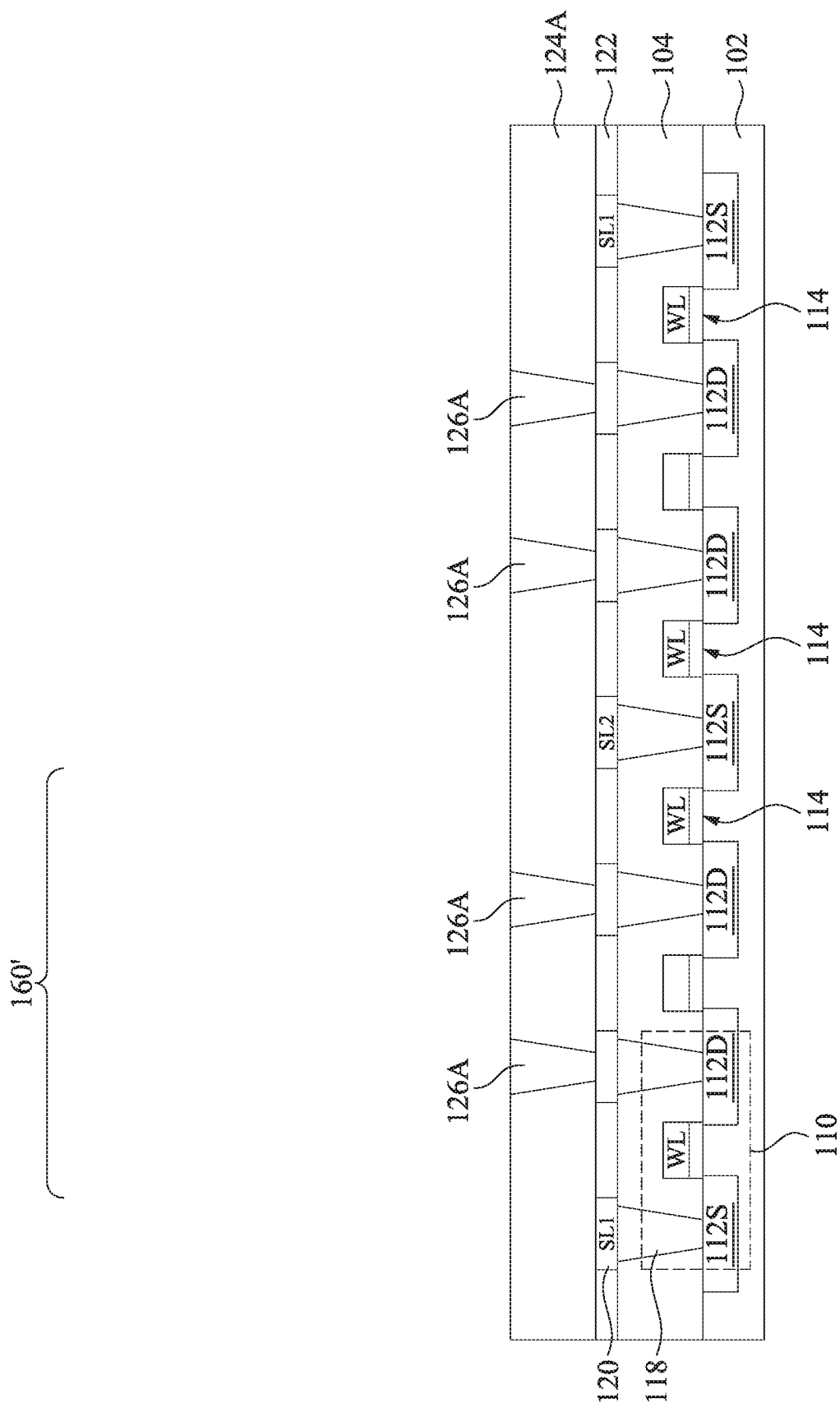

In FIG. 5, vias 126A are formed within a dielectric layer 124A to make electrical connection to the conductive lines 120, in accordance with some embodiments. In some embodiments, the dielectric layer 124A is first formed over the conductive lines 120 and the dielectric layer 122. The dielectric layer 124A may be a material similar to those described above for the dielectric layer 104, and may be formed using similar techniques. Openings may be formed in the dielectric layer 124A to expose the conductive lines 120 using a photolithography and etching process. For example, a photoresist structure may be formed over the dielectric layer 124A and patterned, and then an anisotropic etching process may be performed using the patterned photoresist structure as an etching mask. Conductive material may be deposited within the openings to form the vias 126A. A planarization process may be used to remove excess conductive material. In some embodiments, a barrier layer is formed before depositing the conductive material. The barrier layer or conductive material of the vias 126A may be similar to those described above for the contact plugs 118, and may be formed using similar techniques.

Figure 6:
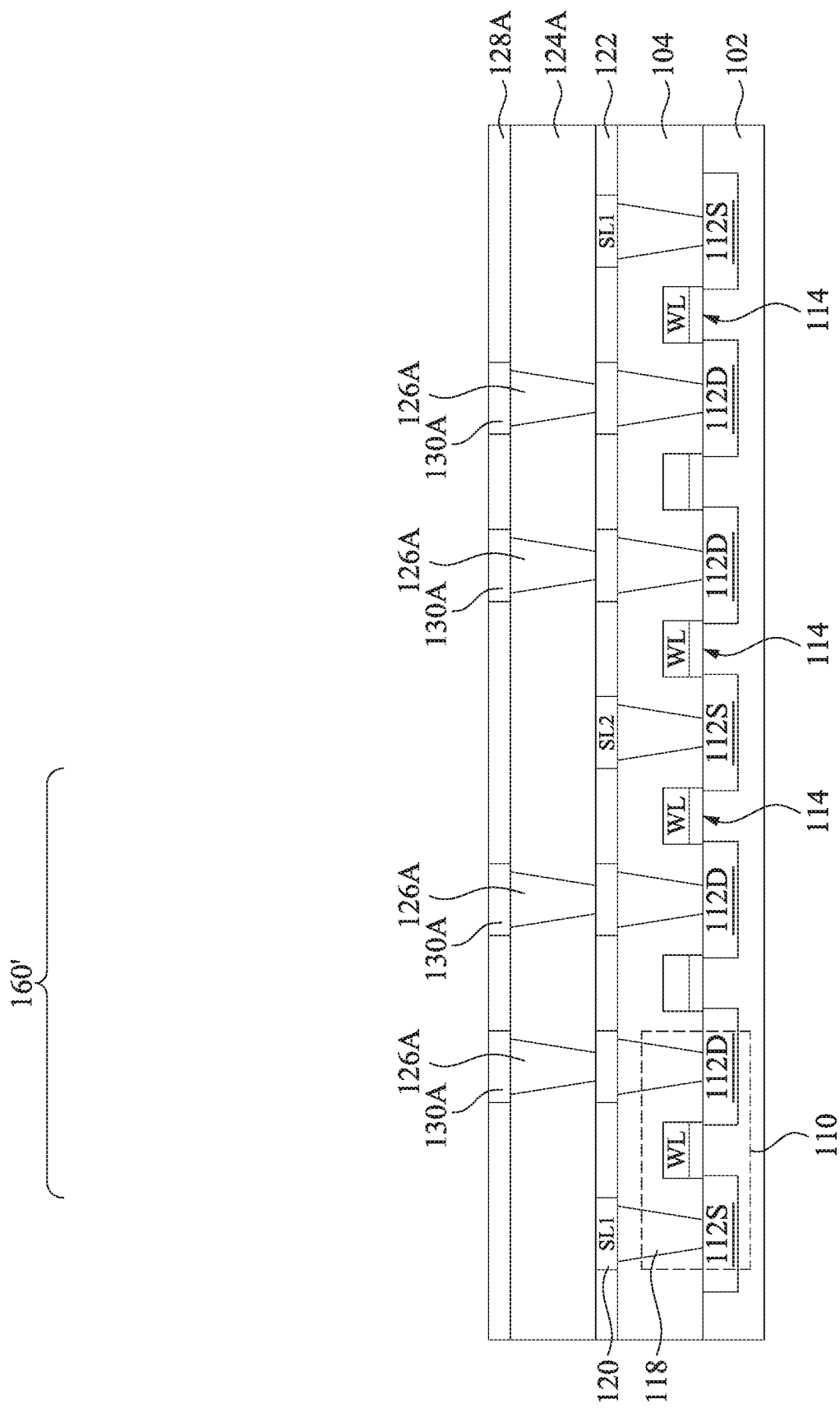

Turning to FIG. 6, conductive lines 130A are formed to provide electrical routing within the SOT-MRAM device 100. The conductive lines 130A may be formed within a dielectric layer 128A that is formed over the dielectric layer 124A. The dielectric layer 128A may be a material similar to those described above for the dielectric layer 104, and may be formed using similar techniques. The dielectric layer 124A and the dielectric layer 128A may be considered an IMD, in some embodiments.

The conductive lines 130A may comprise materials similar to those described above for the conductive lines 120 (see FIGS. 4A-4B), and may be formed using similar techniques. For example, conductive lines 130A may be formed using a suitable technique such as damascene, dual-damascene, plating, deposition, the like, or combinations thereof. In some embodiments, a conductive material of the vias 126A and the conductive lines 130A may be deposited in the same step, for example, if a dual-damascene process is used to form the vias 126A and the conductive lines 130A. In some embodiments, the linewidth of the conductive lines 130A may be greater than the linewidth of the conductive lines 120.

In some embodiments, additional sets of vias and conductive lines similar to vias 126A and conductive lines 130A may be formed to provide additional electrical routing within the SOT-MRAM device 100. For example, additional alternating layers of conductive lines and vias may be formed over the contact plugs 118 before the forming the conductive lines 120. In some embodiments, additional alternating layers of vias and conductive lines may be formed over the conductive lines 130A. In this manner, other configurations of electrical routing within the SOT-MRAM device 100 may be used, and all such configurations are considered within the scope of the present disclosure.

Figure 7:
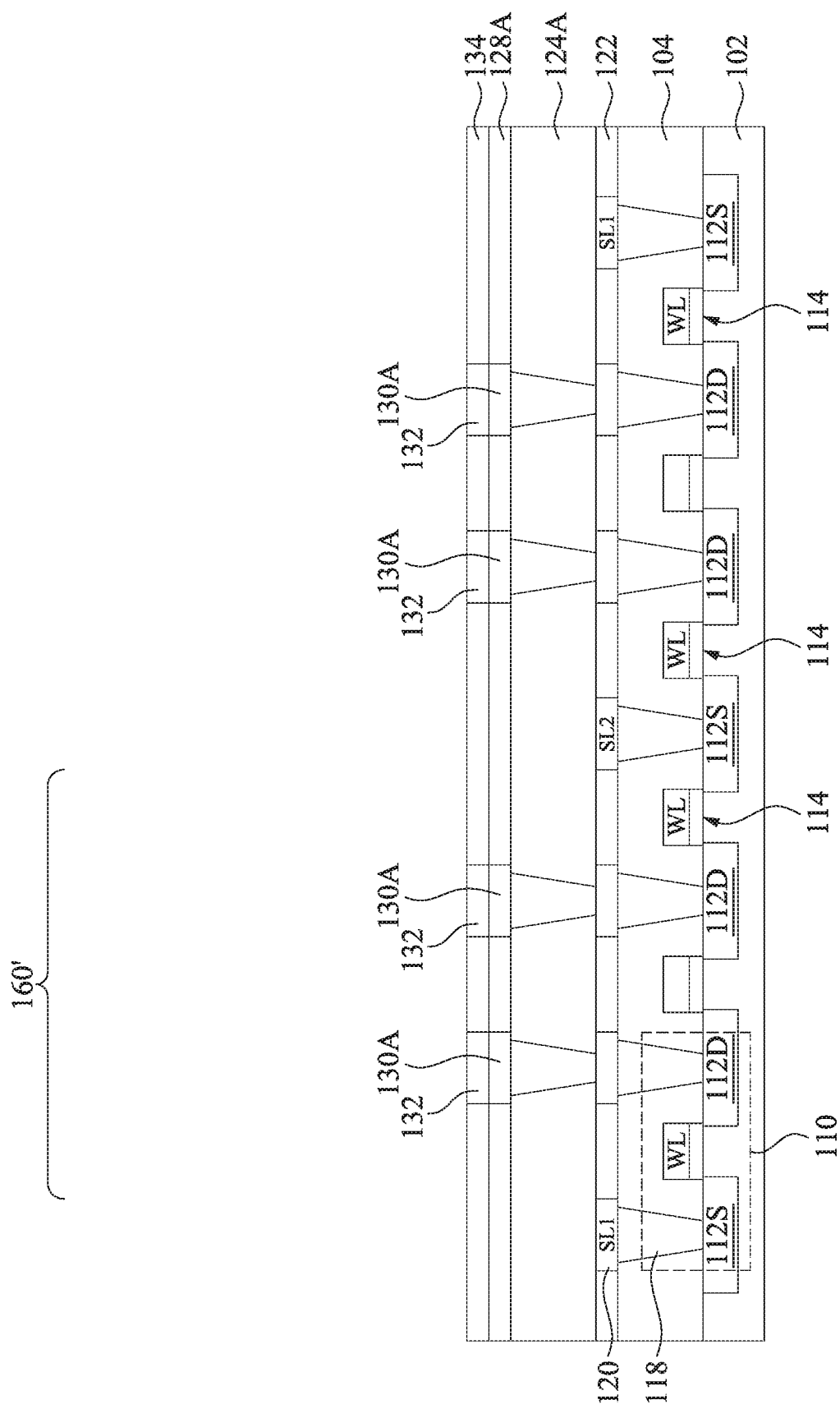

Turning to FIG. 7, bottom electrodes 132 are formed to electrically connect the subsequently formed SOT-MRAM structure 150 to the conductive lines 130A. The bottom electrodes 132 may be formed within a dielectric layer 134 that is formed over the dielectric layer 128A. The dielectric layer 134 may be a material similar to those described above for dielectric layer 104 (see FIGS. 2A-2B), and may be deposited using similar techniques as dielectric layer 104.

In some embodiments, the bottom electrodes 132 are formed of multiple layers of material. The material of the bottom electrodes 132 may include Cu, Al, Ti, Ta, W, Pt, Ni, Cr, Ru, Co, $Co_xFe_yB_zW_w$, titanium nitride (TiN), tantalum nitride (TaN), the like, combinations thereof, or multiple layers thereof. For example, the bottom electrodes 132 may include a tantalum nitride layer and a titanium nitride layer formed over the tantalum nitride layer. The material of the bottom electrodes 132 may be deposited using one or more suitable techniques such as CVD, ALD, PVD, sputtering, plating, the like, or combinations thereof.

In some embodiments, the bottom electrodes 132 are formed by first depositing the material of the bottom electrodes 132 as one or more blanket layers over the dielectric layer 128A and the conductive lines 130A. The material of the bottom electrodes 132 may then be patterned using, for example, a suitable photolithography and etching process to form the bottom electrodes 132. The dielectric layer 134 may then be deposited over the bottom electrodes 132 and a planarization process performed to expose the bottom electrodes 132.

In some embodiments, the bottom electrodes 132 are formed by first depositing the dielectric layer 134 and patterning the dielectric layer 134 to form openings (e.g., using a suitable photolithography and etching process), and then filling the openings in the dielectric layer 134 with the material of the bottom electrodes 132. In some embodiments, a planarization process such as a CMP process or a grinding process may be performed to remove excess portions of the material of the bottom electrodes 132.

Turning to FIGS. 8 through 11A-11B, the formation of SOT-MRAM structures 150 is shown, in accordance with some embodiments. The SOT-MRAM structures 150 (see FIGS. 11A-11B) include multiple layers that provide the magnetic memory functionality of the cells 160 of the SOT-MRAM device 100. For example, each cell 160 may include one SOT-MRAM structure. In some embodiments, the SOT-MRAM structure 150 is formed by depositing multiple layers as blanket layers and then patterning the layers to form the SOT-MRAM structures 150 having the desired shape and configuration. In some embodiments, the layers of the SOT-MRAM structures 150 include a Spin-Orbit Torque (SOT) layer 136, a Magnetic Tunnel Junction (MTJ) stack 138, and a top electrode 142. The SOT layer 136, the MTJ stack 138, and/or the top electrode 142 of the SOT-MRAM structures 150 may each include one or more layers of one or more materials.

Figure 8:
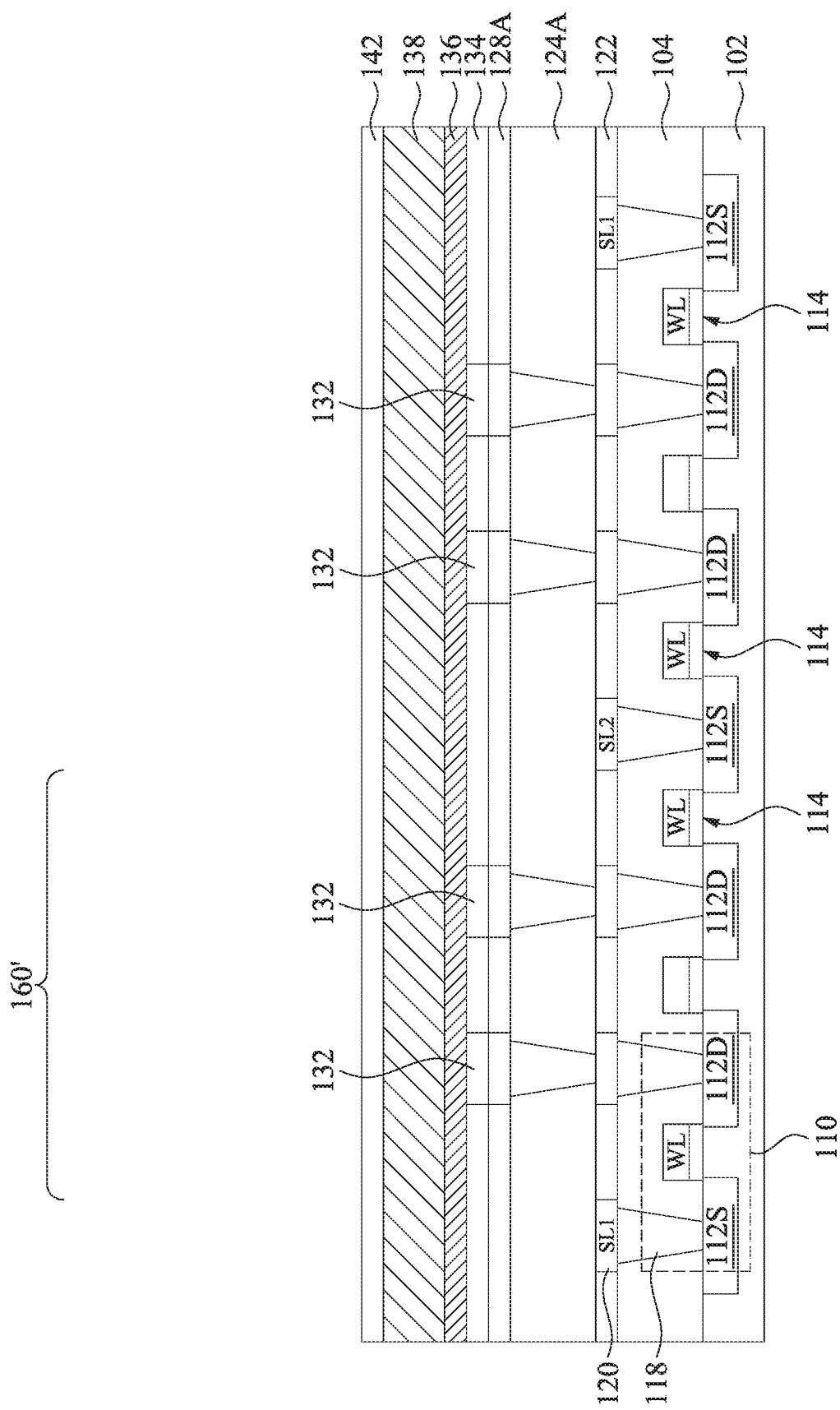

In FIG. 8, the layers of the SOT-MRAM structures 150 are deposited as blanket layers, in accordance with some embodiments. As shown in FIG. 8, the SOT layer 136 may first be deposited over the dielectric layer 134 and the bottom electrodes 132. The MTJ stack 138 may then deposited over the SOT layer 136, and the top electrode 142 may then deposited over the MTJ stack 138. The SOT layer 136, the MTJ stack 138, and/or the top electrode 142 may be deposited using one or more suitable deposition techniques, depending on the material being deposited. The deposition techniques may include techniques such as CVD, PVD, ALD, sputtering, plating, the like, or a combination thereof.

Referring to FIG. 9, the layers deposited to form the SOT layer 136, the MTJ stack 138, and the top electrode 142 of a SOT-MRAM structure 150 are shown, in accordance with some embodiments. The layers of the SOT-MRAM structure 150 described in FIG. 9 are a representative example, and SOT-MRAM structures, SOT layers, MTJ stacks, or top electrodes having other layers, materials, arrangements, compositions, or dimensions are considered within the scope of the present disclosure.

In some embodiments, the SOT layer 136 is first deposited, and makes electrical contact with the bottom electrodes 132. Within a cell 160 of the SOT-MRAM device 100, the SOT layer 136 acts as a generator of a spin polarized current. By conducting a current through the SOT layer 136 of the cell 160, spin polarized currents are generated in transverse directions, and these spin polarized currents are used to control the magnetic moment of the overlying free layer 140A of the MTJ stack 138. By forming the SOT layer 136 below the MTJ stack 138 instead of above the MTJ stack 138, the number of process steps may be reduced. For example, additional process steps to form a via adjacent the MTJ stack 138 that connects to the SOT layer 136 are avoided.

In some embodiments, the SOT layer 136 is formed of a heavy metal or a metal alloy, such as W, Ta, Pt, AuPt, $W_3Ta$, $Bi_xSe_y$, BiSeTe, multi-layers thereof, alloys thereof, the like, or combinations thereof. The thickness of the SOT layer 136 may be between about 1 nm and about 20 nm, such as about 5 nm. In some cases, the thickness of the SOT layer 136 may be optimized for the composition or other characteristics of the SOT layer 136. For example, the use of a thicker SOT layer 136 can increase the spin polarized current that is generated, but spin diffusion can also reduce the efficiency of thicker SOT layers 136. The amount of spin diffusion in an SOT layer 136 can depend on the spin diffusion length of the material of the SOT layer 136. In this manner, a thickness of the SOT layer 136 can be chosen to maximize performance of the cell 160 for a given application and a given material used for the SOT layer 136.

The MTJ stack 138 is then formed over the SOT layer 136, which includes a free layer 140A, a barrier layer 140B, a reference layer 140C, a spacer layer 140D, and a Synthetic Anti-Ferromagnetic (SAF) layer 140E in some embodiments. The free layer 140A of the MTJ stack 138 may be deposited over the SOT layer 136. Within the MTJ stack 138 of a cell 160, the free layer 140A acts as a state-keeping layer, and its magnetic state determines the state of the cell 160. For example, the magnetic moment of the free layer 140A is controllable (e.g., by controlling a current flowing in the SOT layer 136), and by controlling the magnetic moment of the free layer 140A in this manner, the resistance of the cell 160 may be put in a high-resistance state or a low-resistance state. Whether the cell 160 is in a high-resistance state or a low-resistance state depends on the relative orientations of the spin polarizations of the free layer 140A and the reference layer 140C. The free layer 140A may be formed of one or more ferromagnetic materials, such as one or more layers of CoFe, NiFe, CoFeB, CoFeBW, Ru, alloys thereof, the like, or combinations thereof. The free layer 140A may include multiple layers of different materials, such as a layer of Ru between two layers of CoFeB, though other configurations of layers or materials may be used. In some embodiments, the material of the free layer 140A includes a crystalline material deposited to have a particular crystalline orientation, such as a (100) orientation. The thickness of the free layer 140A may be between about 0.4 nm and about 4 nm. In some embodiments, a free layer 140A having an in-plane magnetic anisotropy (IMA) may have a thickness between about 1.3 nm and about 4 nm, or a free layer 140A having a perpendicular-to-plane magnetic anisotropy (PMA) may have a thickness between about 0.4 nm and about 1.3 nm. A suitable thickness of the free layer 140A may be determined by the composition of the free layer 140A or the magnetic properties of the free layer 140A.

The barrier layer 140B may be deposited over the free layer 140A. In some embodiments, the barrier layer 140B is formed of one or more materials such as MgO, AlO, AlN, the like, or combinations thereof. In some embodiments, the material of the barrier layer 140B includes a crystalline material deposited to have a particular crystalline orientation, such as a (100) orientation. The material of the barrier layer 140B may be deposited to have the same crystalline orientation as the free layer 140A. In some embodiments, the barrier layer 140B may have a thickness between about 0.6 nm and about 3 nm, such as about 1 nm. In some cases, controlling the thickness of the barrier layer 140B may control the resistance ($R_{MTJ}$) of the MTJ stack 138. For example, a thicker barrier layer 140B may increase the resistance of the MTJ stack 138. In some embodiments, performance of a cell 160 can be improved by controlling the resistance $R_{MTJ}$ of the MTJ stack 138 to match the parasitic resistance of the circuit(s) connected to the cell 160. In some cases, matching the resistances in this manner can increase the ranges of operational conditions over which the cell 160 can be read. The barrier layer 140B may be thin enough such that electrons are able to tunnel through the barrier layer 140B.

The reference layer 140C may be deposited over the barrier layer 140B. The reference layer 140C may be formed of a ferromagnetic material, such as one or more layers of CoFe, NiFe, CoFeB, CoFeBW, alloys thereof, the like, or combinations thereof. In some embodiments, the material of the reference layer 140C includes a crystalline material deposited to have a particular crystalline orientation, such as a (100) orientation. The material of the reference layer 140C may be deposited to have the same crystalline orientation as the barrier layer 140B. The thickness of the reference layer 140C may be between about 1 nm and about 3 nm, in some embodiments. In some cases, controlling the thickness of the reference layer 140C may control the resistance ($R_{MTJ}$) of the MTJ stack 138. For example, a thicker reference layer 140C may increase the resistance of the MTJ stack 138. The thickness of the reference layer 140C may be controlled in this manner to match the resistance RMTJ of the MTJ stack 138 to the parasitic resistance of the associated circuit, as described previously.

The spacer layer 140D may be deposited over the reference layer 140C. In some embodiments, the spacer layer 140D is formed of a material such W, Mo, the like, or combinations thereof. In some embodiments, the spacer layer 140D may have a thickness between about 2 Å and about 1 nm. In some embodiments, a thicker spacer layer 140D may be used to reduce the effects of crystalline lattice mismatch on the reference layer 140C or free layer 140A from overlying layers. The spacer layer 140D may be thin enough such that electrons are able to tunnel through the spacer layer 140D.

The Synthetic Anti-Ferromagnetic (SAF) layer 140E may be formed over the spacer layer 140D. The SAF layer 140E is used to pin the spin polarization direction of the reference layer 140C in a fixed direction. Pinning the spin polarization direction of the reference layer 140C allows the cell 160 of the SOT-MRAM device 100 to be toggled between a low-resistance state and a high-resistance state by changing the spin polarization direction of the free layer 140A relative to the reference layer 140C. Because the SAF layer 140E and the reference layer 140C are formed over the free layer 140A, the example MTJ stack 138 shown in FIG. 9 may be considered a "top-pinned" MTJ stack.

The SAF layer 140E may include multiple layers of different materials, in some embodiments. For example, the SAF layer 140E may comprise a stack of one or more ferromagnetic layers and one or more non-magnetic layers. For example, the SAF layer 140E may be formed from a non-magnetic layer sandwiched between two ferromagnetic layers or may be a stack of alternating non-magnetic layers and ferromagnetic layers. The ferromagnetic layers may be formed of a material such as Co, Fe, Ni, CoFe, NiFe, CoFeB, CoFeBW, alloys thereof, the like, or combinations thereof. The non-magnetic layers may be formed of material such as Cu, Ru, Ir, Pt, W, Ta, Mg, the like, or combinations thereof. In some embodiments, the ferromagnetic layer(s) of the SAF layer 140E may have a thickness between about 1 nm and about 3 nm. In some embodiments, a thicker SAF layer 140E may have stronger antiferromagnetic properties, or may be more robust against against external magnetic fields or thermal fluctuation. In some embodiments, the non-magnetic layer(s) of the SAF layer 140E may have a thickness between about 2 Å and about 1 nm. For example, the SAF layer 140E may include a layer of Ru that has a thickness of about 0.4 nm or about 0.85 nm, though other layers or thicknesses are possible. In some embodiments, one or more layers of the SAF layer 140E includes a crystalline material deposited to have a particular crystalline orientation, such as a (111) orientation.

The top electrode 142 may include one or more layers deposited over the MTJ stack 138 to protect the MTJ stack 138 and provide electrical connection to the top of the MTJ stack 138. For example, the top electrode 142 may include one or more layers deposited over the SAF layer 140E of the MTJ stack 138, as shown in FIG. 9. The top electrode 142 may include one or more layers of materials such as Cu, Al, Ti, Ta, W, Pt, Ni, Cr, Ru, Co, Zr, titanium nitride (TiN), tantalum nitride (TaN), the like, combinations thereof, or multiple layers thereof. For example, the top electrode 142 may include a Ru layer and a Ta layer formed over the Ru layer. In some embodiments, the spacer layer 140D may have a thickness between about 1 nm and about 5 nm, such as about 4 nm. For example, the top electrode 142 may include a Ru layer having a thickness of about 2 nm and a Ta layer having a thickness of about 2 nm that is formed over the Ru layer. In other embodiments, the top electrode 142 may include different layers and/or layers of different thicknesses than this example. In some cases, the top electrode 142 may be considered a "capping layer," or one or more layers within the top electrode 142 may be considered "capping layers."

Figure 10A:
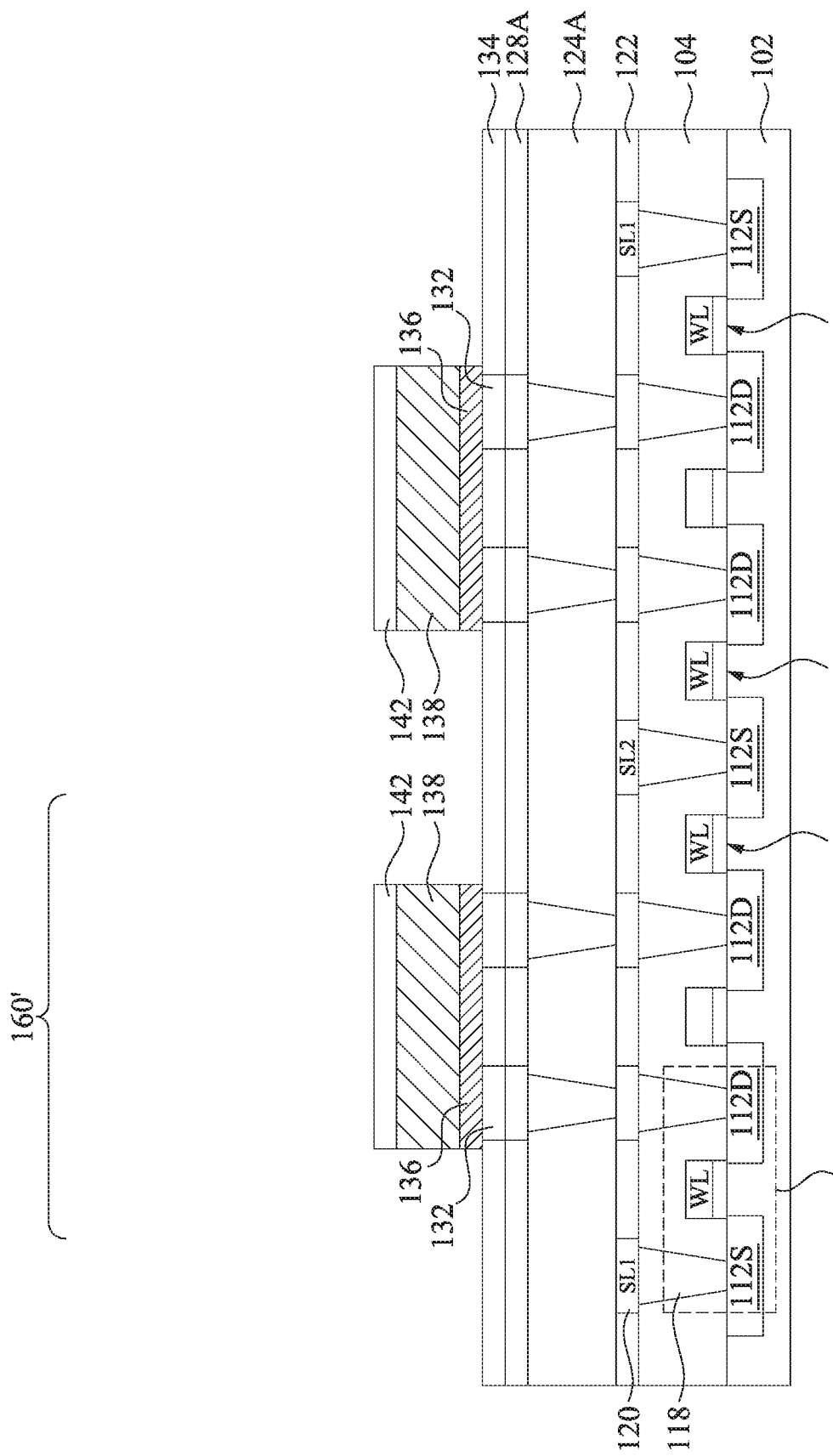
Figure 10B:
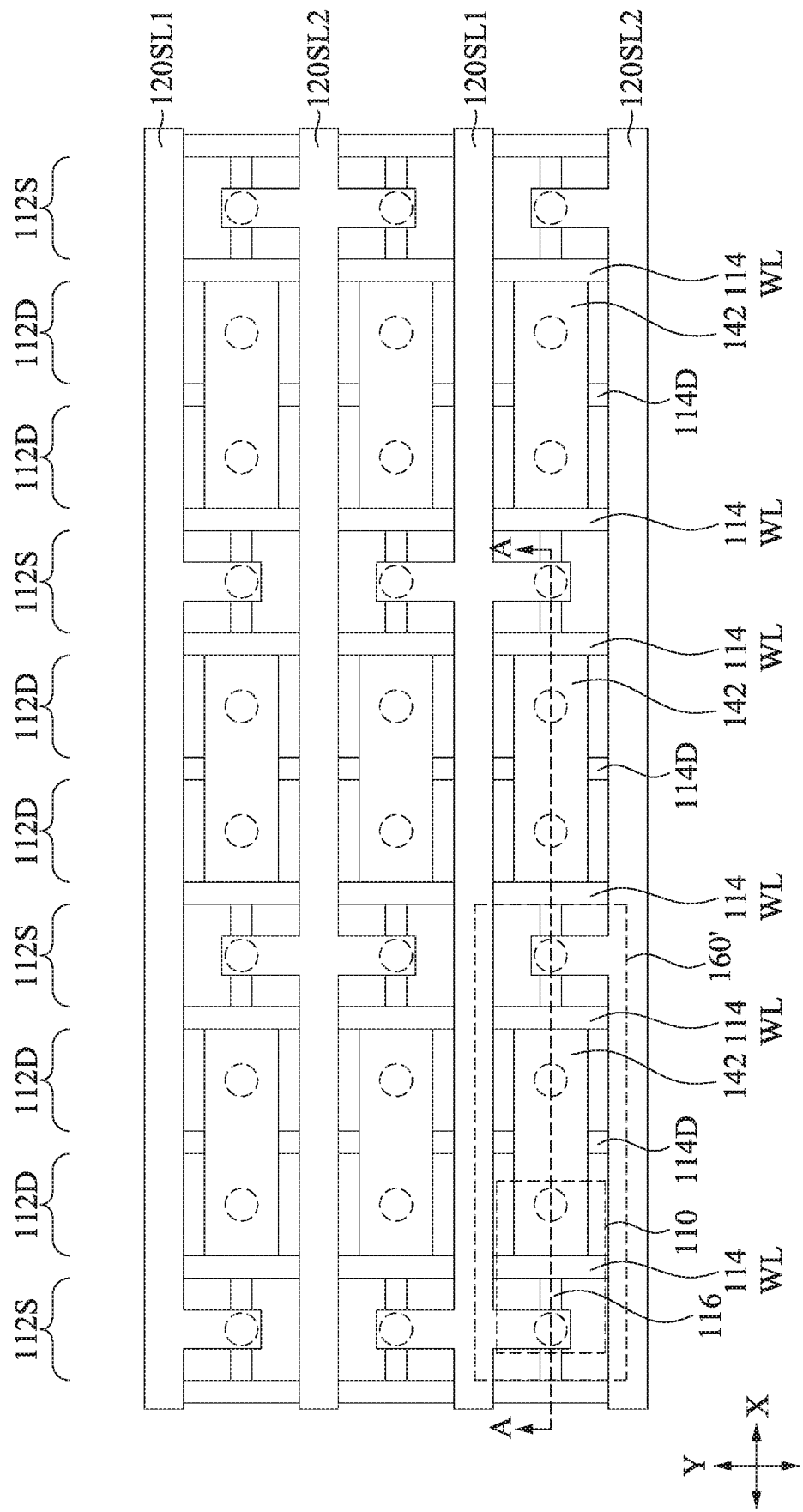

Turning to FIGS. 10A-10B, a first patterning process is performed to pattern the SOT layer 136, the MTJ stack 138, and the top electrode 142. The first patterning process may include a suitable photolithography and etching process. For example, a photoresist structure (not shown) may be formed over the top electrode 142 and patterned to form an etching mask. The photoresist structure may include, for example, a patterned photoresist, and may also include a hard mask underlying the patterned photoresist. In some embodiments, the photoresist may be used to pattern the hard mask, and then the hard mask may be used to pattern the underlying layers. The underlying SOT layer 136, the MTJ stack 138, and the top electrode 142 may then be etched using one or more anisotropic etching processes. The etching processes may include, for example, one or more a plasma etching processes. Regions of the dielectric layer 134 may be exposed by the first patterning process, as shown in FIG. 10A.

In some embodiments, the pattern etched in the SOT layer 136 by the first patterning process defines the shape, size, or lateral dimensions of the SOT layer 136 of each cell 160 within the SOT-MRAM device 100. For example, each cell 160 may include a SOT layer 136 having a length L1 that is between about 50 nm and about 500 nm and a width W1 that is between about 10 nm and about 100 nm. In some embodiments, a SOT layer 136 may have an area between about 500 nm$^2$ and about 50000 nm$^2$. In some embodiments, the SOT layer 136 within each cell 160 extends across two adjacent bottom electrodes 132 and is electrically connected to the two bottom electrodes 132. In this manner, current may be conducted through the SOT layer 136 from a first bottom electrode 132 to a second bottom electrode 132. In the present disclosure, the direction that the current flows through the SOT layer 136 is considered approximately parallel to "the x-axis," and the x-axis and corresponding y-axis are labeled in FIG. 11B and some other subsequent Figures.

Figure 11A:
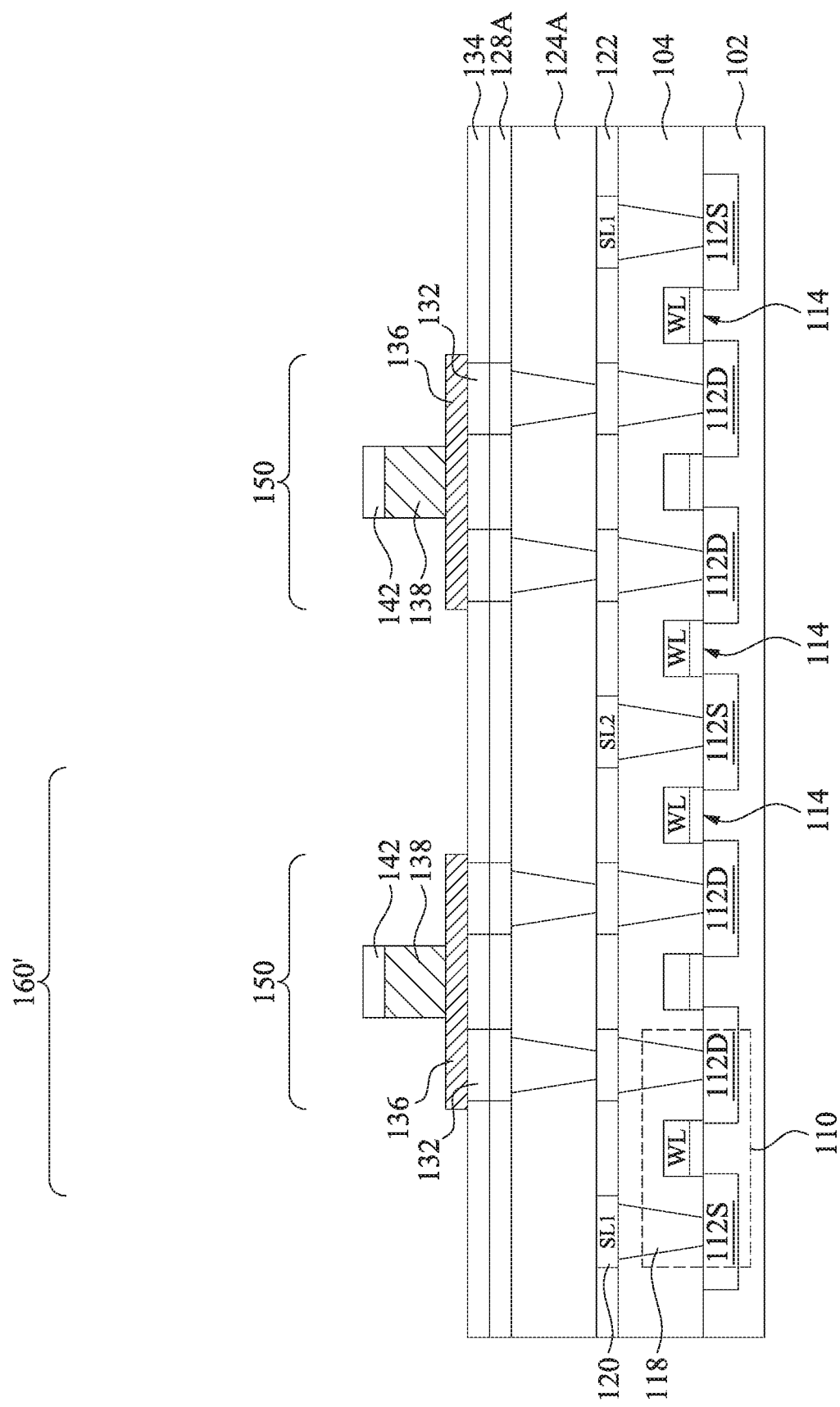
Figure 11B:
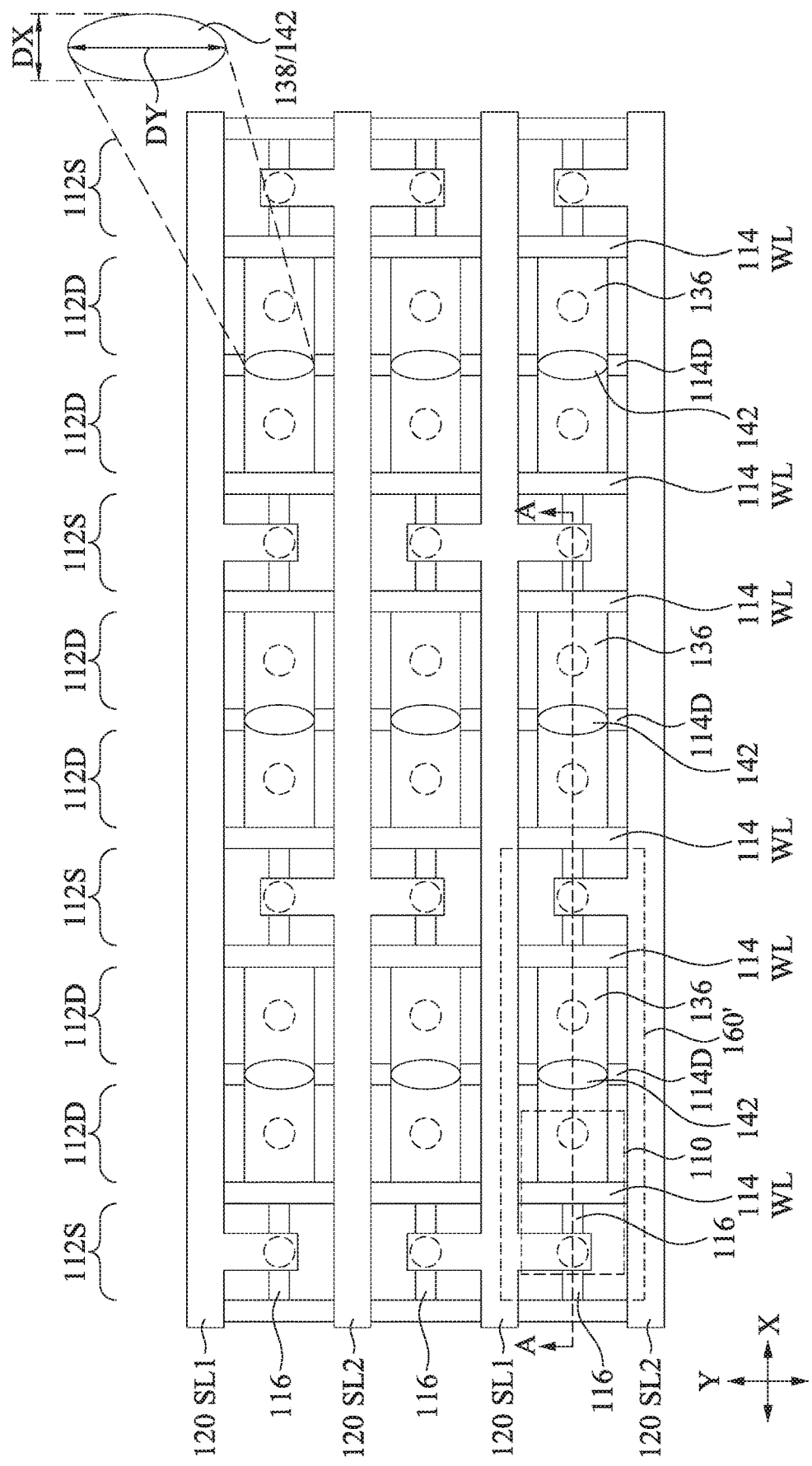

Turning to FIGS. 11A-11B, a second patterning process is performed to pattern the MTJ stack 138 and the top electrode 142, forming the SOT-MRAM structures 150. The second patterning process may include a suitable photolithography and etching process. For example, a photoresist structure (not shown) may be formed over the top electrode 142 and the dielectric layer 134. The photoresist structure may then be patterned to form an etching mask. The photoresist structure may include, for example, a patterned photoresist, and may also include a hard mask underlying the patterned photoresist. In some embodiments, the photoresist may be used to pattern the hard mask, and then the hard mask may be used to pattern the underlying layers. The underlying MTJ stack 138 and top electrode 142 may then be etched using one or more anisotropic etching processes. The etching processes may include, for example, one or more a plasma etching processes. In some embodiments, the SOT layer 136 is used as an etch stop layer. In this manner, the second patterning process reshapes the MTJ stack 138 and the top electrode 142 to have the desired shape and size over the SOT layer 136. Additionally, the use of the SOT layer 136 to electrically connect the bottom electrodes 132 rather than forming additional conductive lines and vias can reduce the amount of routing (and thus the size) of a cell 160.

As shown in FIGS. 11A-11B, the second patterning process etches the MTJ stack 138 and the top electrode 142 such that the MTJ stack 138 and the top electrode 142 have a smaller lateral area than the SOT layer 136. The resulting shape of the MTJ stack 138 and top electrode 142 may have an approximately circular shape, or may have an oblong shape, such an elliptical shape, rounded rectangle shape, or the like. As an example, FIG. 11B shows a magnified illustration of the MTJ stack 138 and the top electrode 142 having an approximately elliptical shape with the longer dimension (e.g, the major axis) along the y-axis and the shorter dimension (e.g., the minor axis) along the x-axis. In the embodiment shown in FIGS. 11A-11B, the MTJ stack 138 is patterned to have a length DX in the x axis that is between about 10 nm and about 100 nm and a length DY in the y-axis that is between about 50 nm and about 500 nm. In some embodiments, having the longer dimension of the MTJ stack 138 in a direction (e.g., the y-axis) perpendicular to the current flow direction along the SOT layer 136 (e.g., the x-axis) can allow for a lower amount of current needed to toggle the resistance state of the cell 160, and also can allow for improved retention of the resistance state of the cell 160. In some embodiments, having the longer dimension of the MTJ stack 138 in the y-axis may allow for the magnetic moment of the free layer 140A of the MTJ stack 138 to be set to either a positive y-direction or in a negative y-direction. The MTJ stack 138 may be circular or have a longer dimension in other directions in other embodiments, and an example such embodiment is described below in FIGS. 17A-17B.

Figure 12:
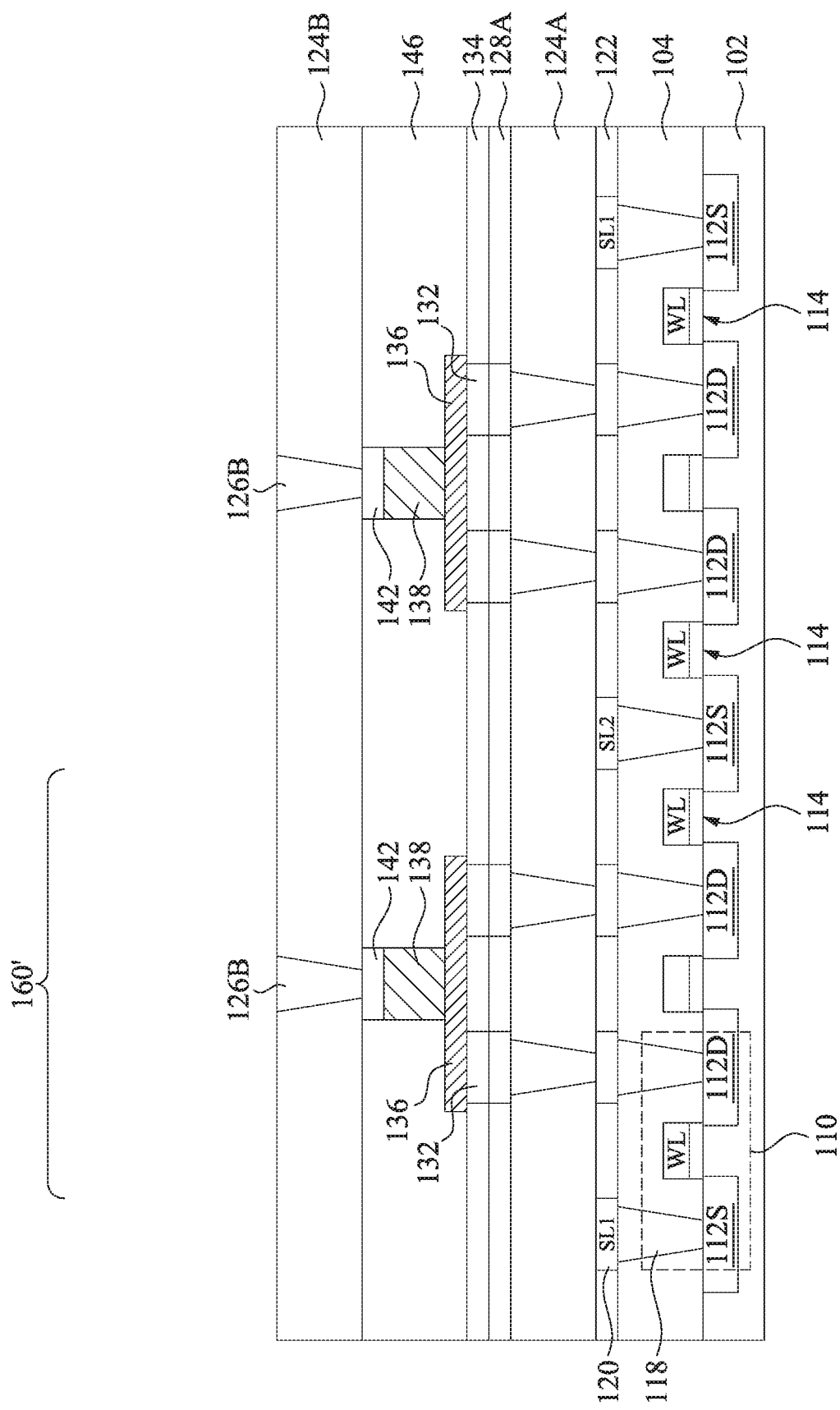

In FIG. 12, vias 126B are formed within a dielectric layer 124B to make electrical connection to the top electrodes 142, in accordance with some embodiments. In some embodiments, a dielectric layer 146 is first formed over the SOT-MRAM structures 150 and over the dielectric layer 134. The dielectric layer 146 may be a material similar to those described above for the dielectric layer 104, and may be formed using similar techniques. In some embodiments, a planarization process (e.g., a CMP or grinding process) may be performed after depositing the material of the dielectric layer 146 to expose the top electrodes 142. In some embodiments, the planarization process may be performed using top electrodes 142 as a CMP stop layer. Accordingly, the top surface of the dielectric material 146 may be level with the top surfaces of the top electrodes 142.

The dielectric layer 124B may then be formed over the dielectric layer 146. The dielectric layer 124B may be a material similar to those described above for the dielectric layer 104 or dielectric layer 124A, and may be formed using similar techniques. In some embodiments, an etch stop layer (not shown in FIG. 12) may first be deposited over the dielectric layer 146 before forming the dielectric layer 124B. Openings may then be formed in the dielectric layer 124B to expose the top electrodes 142 using a photolithography and etching process. For example, a photoresist structure may be formed over the dielectric layer 124B and patterned, and then an anisotropic etching process may be performed using the patterned photoresist structure as an etching mask. If an etch stop layer is present, it may be used as an etch stop during the etching process.

Conductive material may then be deposited within the openings to form the vias 126B. A planarization process may be used to remove excess conductive material. In some embodiments, a barrier layer is formed before depositing the conductive material. The barrier layer or conductive material of the vias 126B may be similar to those described above for the contact plugs 118 or vias 126A, and may be formed using similar techniques.

Turning to FIGS. 13A-13B, conductive lines 130B are formed to provide electrical routing within the SOT-MRAM device 100 and to form cells 160 within the SOT-MRAM device 100. The conductive lines 130B may be formed within a dielectric layer 128B that is formed over the dielectric layer 124B. The dielectric layer 128B may be a material similar to those described above for the dielectric layer 104 or dielectric layer 128A, and may be formed using similar techniques. The dielectric layer 124B and the dielectric layer 128B may be considered an IMD, in some embodiments.

The conductive lines 130B may comprise materials similar to those described above for the conductive lines 120 or conductive lines 130A, and may be formed using similar techniques. For example, conductive lines 130B may be formed using a suitable technique such as damascene, dual-damascene, plating, deposition, the like, or combinations thereof. In some embodiments, a conductive material of the vias 126B and the conductive lines 130B may be deposited in the same step, for example, if a dual-damascene process is used to form the vias 126B and the conductive lines 130B.

As shown in FIG. 13A, the conductive lines 130B make electrical contact to the top electrodes 142 through the vias 126B, and thus form cells 160 of the SOT-MRAM device 100. Some example cells 160 have been labeled in FIGS. 13A-13B. In some embodiments, portions of conductive lines 130B are used as a Read Bit Lines ("RBL") for each cell 160 in the SOT-MRAM device 100 (described in greater detail below), and have been labeled as "RBL" accordingly. The embodiments of the present disclosure may allow for cells 160 to be formed having smaller lateral dimensions, which can increase the memory density of an SOT-MRAM device 100 and can allow for improved operational speed due to shorter routing distance within and between the cells 160. In some embodiments, a cell 160 may be formed having a length L2 that is between about 30 nm and about 300 nm and a width W2 that is between about 20 nm and about 200 nm. In some embodiments, a cell 160 may have an area between about 600 nm$^2$ and about 60000 nm$^2$. In some embodiments, a cell 160 comprises portions of three adjacent gate structures 114 and the length L2 of a cell 160 is at least partially determined by the spacing between the gate structures 114. For example, the length L2 of a cell 160 may be about three times the spacing between adjacent gate structures 114. In some embodiments, a cell 160 comprises portions of three adjacent fins 116 and the width W2 of a cell 160 is at least partially determined by the spacing between the fins 116. For example, the width W2 of a cell 160 may be about two times the spacing between adjacent fins 116.

Turning to FIG. 14, additional vias 126C and conductive lines 130C are formed to form the SOT-MRAM device 100, in accordance with some embodiments. FIG. 14 shows a single set of vias (vias 126C) and conductive lines (conductive lines 130C) formed over the conductive lines 130B, but multiple sets of vias and/or conductive lines may be formed in a stack, in other embodiments. The multiple sets of vias and conductive lines may be formed in a similar manner as the vias 126C and conductive lines 130C. The vias 126C and conductive lines 130C may be similar to the vias 126B and conductive lines 130B, and may be formed of similar materials and in a similar manner. As shown in FIG. 14, the vias 126C may be formed in a dielectric layer 124C, and the conductive lines 130C may be formed in a dielectric layer 128C. The dielectric layer 124C and/or the dielectric layer 128C may be considered an IMD.

Figure 15:
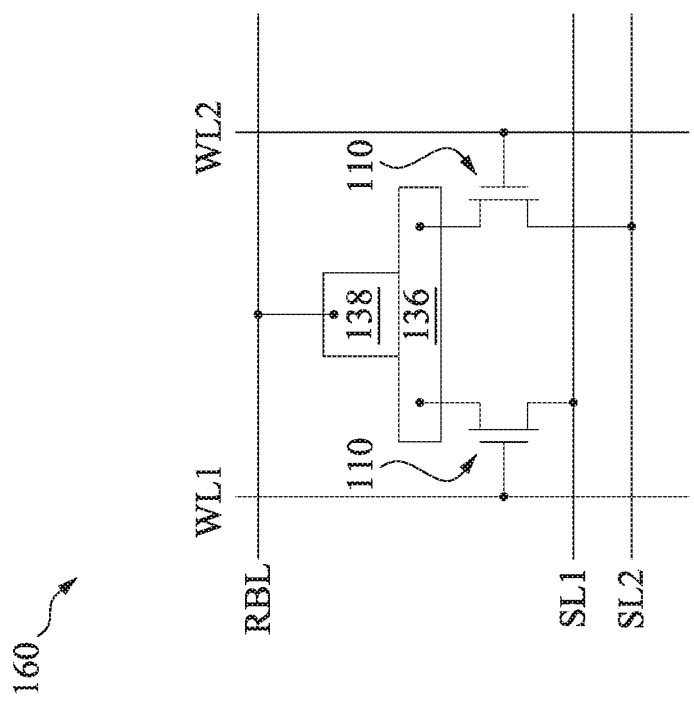
FIGS. 15 and 16 illustrate reading and writing operations of SOT-MRAM cells in accordance with some embodiments.

FIG. 15 illustrates a schematic of a cell 160 of an SOT-MRAM device 100 and voltages corresponding to reading and writing operations, in accordance with some embodiments. The cell 160 includes two transistors 110 whose drains are coupled to the SOT layer 136. The source of the first transistor 110 is coupled to a first Source Line "SL1," which may be SL1 conductive line 120 as shown in e.g., FIG. 14. The source of the second transistor 110 is coupled to a second Source Line "SL2," which may be SL2 conductive line 120 as shown in e.g., FIG. 14. The gate structure 114 of a first transistor 110 is coupled to a first Word Line "WL1" and the gate structure 114 of a second transistor 110 is coupled to a second Word Line "WL2." Each Word Line WL1 and WL2 may be electrically connected to a gate structure 114 of a transistor 110, such as corresponding gate structures 114 labeled "WL" shown in e.g., FIG. 14. In some embodiments, a first conductive line may be electrically coupled to the WL1 gate structure 114 and a second conductive line may be electrically coupled to the WL2 gate structure 114. The MTJ stack 138 of the cell 160 is coupled to a Read Bit Line "RBL," which may be a conductive line 130B as shown in e.g., FIG. 14. The cells 160 described herein use the same Word Lines (WL1, WL2) for reading operations and writing operations, and thus the amount of routing can be reduced, for example, relative to a cell configuration that has separate Word Lines for reading operations and a for writing operations. By combining Word Lines for reading and writing operations in this manner, the size of the cells may be reduced, and the resistance of the Word Lines may be reduced.

Referring to the table in FIG. 15, a reading operation of the cell 160 is performed by applying a voltage "Vr" to the RBL, applying a zero voltage (e.g., using as a ground ("GND")) to SL1 and SL2, and applying a voltage "Vg" to WL1 and WL2. In this manner, the transistors 110 are turned on, allowing current to flow from RBL, through the MTJ stack 138, and to SL1/SL2. The amount of current that flows between SL1/SL2 and RBL indicates whether the cell 160 is in a high-resistance state or a low-resistance state. The high-resistance and low-resistance states of the cell 160 correspond to different bit states (e.g., "0" or "1"), and thus the amount of current indicates whether the bit state of the cell 160 corresponds to a "0" or a "1." In some cases, using both SL1 and SL2 as a GND as described can reduce the resistance of the reading operation, which can lower power consumption and improve reading speed.

A writing operation of the cell 160 is performed by flowing a current across the SOT layer 136, generating spin polarized currents in the SOT layer 136 that transfer their spin to the free layer 140A of the MTJ stack 138 and set the magnetic moment of the free layer 140A to one of two directions. The direction of current within the SOT layer 136 determines the direction to which the magnetic moment of the free layer 140A is set. The two directions of the magnetic moment of the free layer 140A correspond to the two states (high-resistance or low-resistance) of the cell 160.

In the cell 160 shown in FIG. 15, the writing operation is performed by applying a voltage "Vg" to WL1 and WL2 and applying different voltages to SL1 and SL2. Which voltages are applied to SL1 and SL2 depend on whether a high-resistance state or a low-resistance state of the cell 160 is desired. During a writing operation, RBL voltage is left floating, as no current flows through the MTJ stack 138. As an example, a "0" may be written to the cell 160 by applying a voltage "Vw" to SL1 and zero voltage (e.g., GND) to SL2. This causes a current to flow across the SOT layer 136 in an x-direction (e.g., left-to-right in FIG. 15), and sets the magnetic moment of the free layer 140A to a corresponding first direction. A "1" may be written to the cell 160 by applying a voltage "Vw" to SL2 and zero voltage (e.g., GND) to SL1. This causes a current to flow across the SOT layer 136 in the opposite x-direction (e.g., right-to-left in FIG. 15), and sets the magnetic moment of the free layer 140A to a corresponding second direction. In this manner, the reading and writing operations of a cell 160 of an SOT-MRAM device 100 may be performed using only two transistors 110.

Figure 16:
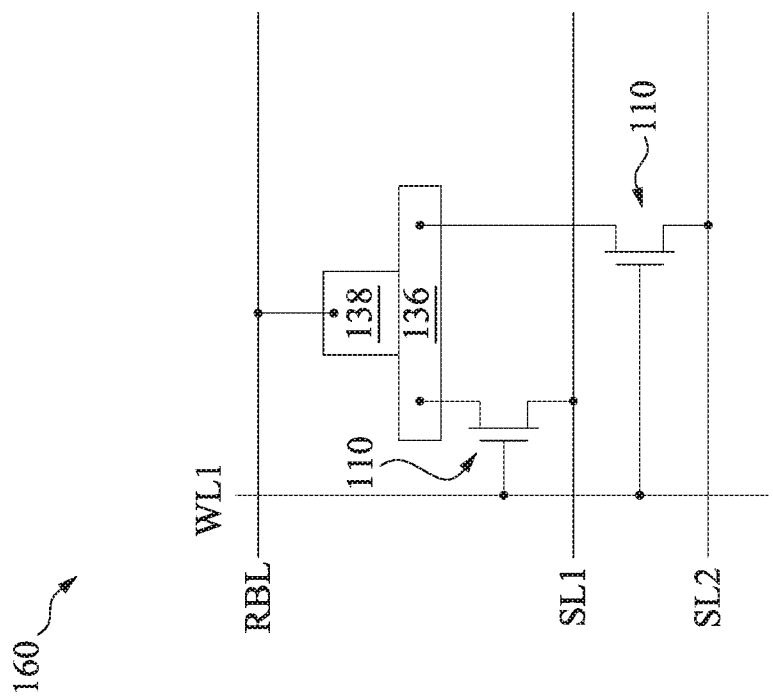

FIG. 16 illustrates a schematic of a cell 160 of an SOT-MRAM device 100 and voltages corresponding to reading and writing operations, in accordance with some embodiments. The cell 160 shown in FIG. 16 is similar to that shown in FIG. 15, except that only a single Word Line "WL" is coupled to both transistors 110, instead of each transistor 110 being coupled to a separate Word Line (e.g., WL1 and WL2). Because the gates of each transistor 110 are set to the same voltage during reading and writing operations, the gates of both transistors 110 may be coupled to the same Word Line (WL), as shown in FIG. 16. For example, a single conductive line may be electrically coupled to the WL gate structures 114 of both transistors 110. In some cases, using a single Word Line (WL) in this manner may reduce the amount of routing within the SOT-MRAM device 100, which may reduce the overall size of the SOT-MRAM device 100.

Referring to the table in FIG. 16, a reading operation of the cell 160 is performed by applying a voltage "Vr" to the RBL, applying a zero voltage (e.g., using as a ground ("GND")) to SL1 and SL2, and applying a voltage "Vg" to WL. The writing operation is performed by applying a voltage "Vg" to WL and applying different voltages to SL1 and SL2. During a writing operation, RBL voltage is left floating, as no current flows through the MTJ stack 138. As an example, a "0" may be written to the cell 160 by applying a voltage "Vw" to SL1 and zero voltage (e.g., GND) to SL2, and a "1" may be written to the cell 160 by applying a voltage "Vw" to SL2 and zero voltage (e.g., GND) to SL1. In some cases, using both SL1 and SL2 as a GND as described can reduce the resistance of the reading operation, which can lower power consumption and improve reading speed.

Figure 17A:
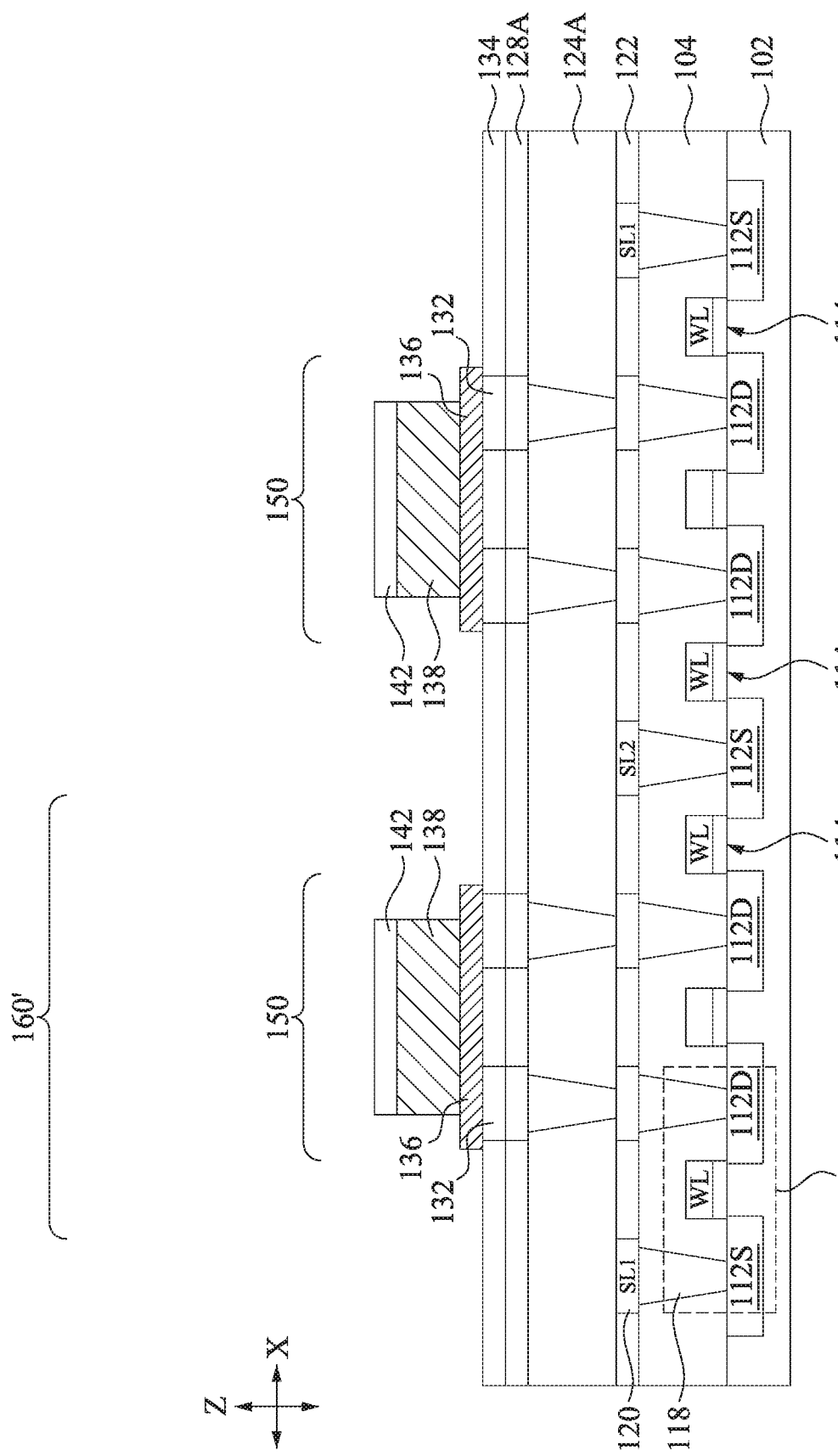
FIGS. 17A, 17B, and 18 illustrate the cross-sectional views and plan views of intermediate stages in the formation of SOT-MRAM devices, in accordance with some embodiments.
Figure 17B:
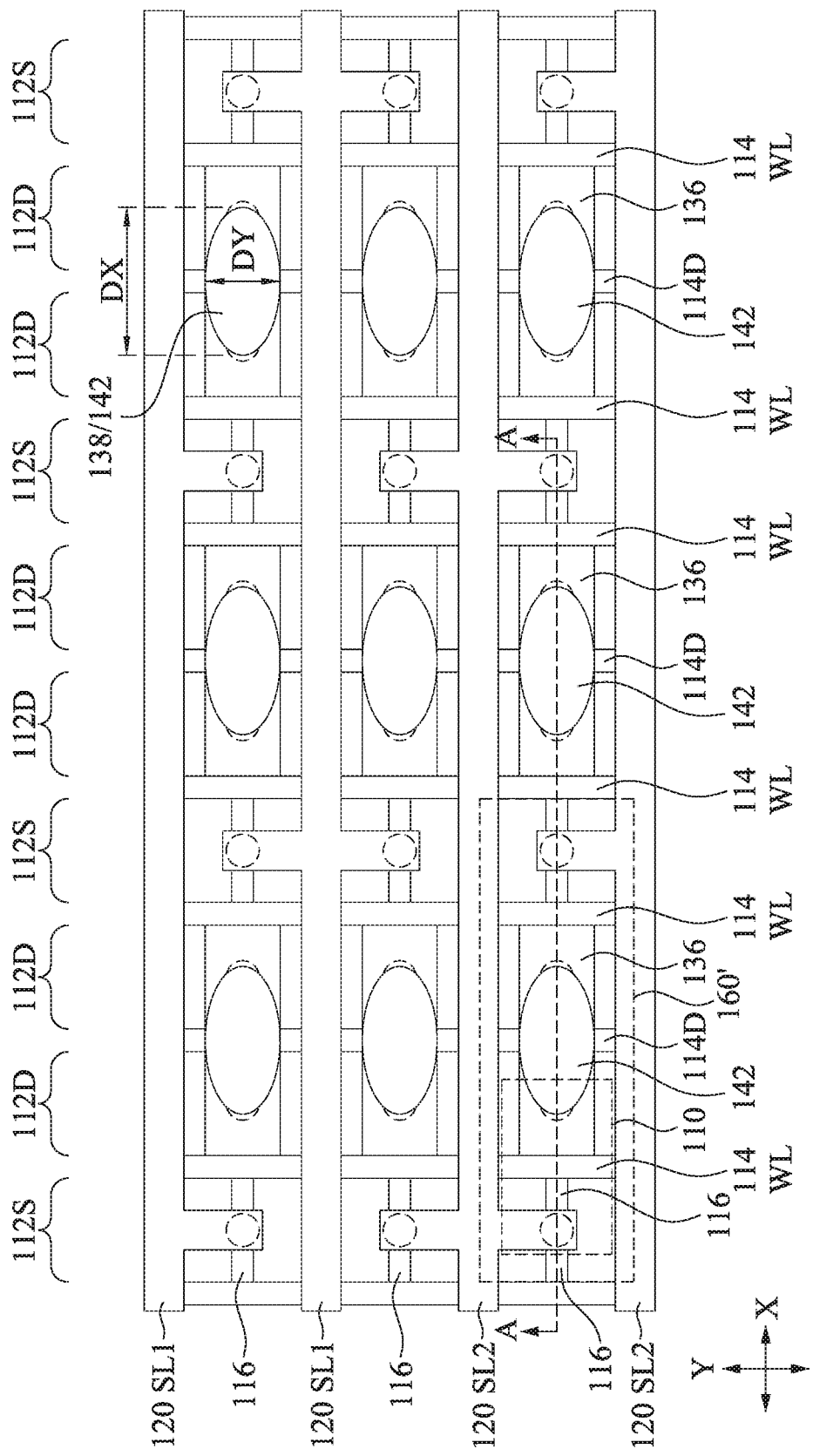

Turning to FIGS. 17A-17B, an intermediate step in the formation of an SOT-MRAM device 100 is shown, in accordance with some embodiments. The structure shown in FIGS. 17A-17B is similar to that shown in FIGS. 11A-11B, except that the MTJ stack 138 and top electrode 142 of the SOT-MRAM structure 150 have been patterned to have an approximately elliptical shape with the longer dimension (e.g, the major axis) along the x-axis and the shorter dimension (e.g., the minor axis) along the y-axis. In some embodiments, having the longer dimension of the MTJ stack 138 in the x-axis may allow the magnetic moment of the free layer 140A of the MTJ stack 138 to be set to either a positive x-direction or in a negative x-direction. In the embodiment shown in FIGS. 17A-17B, the MTJ stack 138 is patterned to have a length DY in the y-axis that is between about 10 nm and about 100 nm and a length DX in the x-axis that is between about 50 nm and about 500 nm. In some embodiments, the MTJ stack 138 may be circular, which may allow the magnetic moment of the free layer 140A of the MTJ stack 138 to be set to either a positive z-direction or in a negative z-direction. In some embodiments, a permanent magnet or an electromagnet (not shown) may be incorporated within the SOT-MRAM device 100 to ensure the deterministic switching of the free layer when the MTJ stack 138 has a longer x-axis dimension or when the MTJ stack 138 is circular in shape. In this manner, a SOT-MRAM structure 150 of a SOT-MRAM device 100 may be formed having different configurations or shapes.

Figure 18:
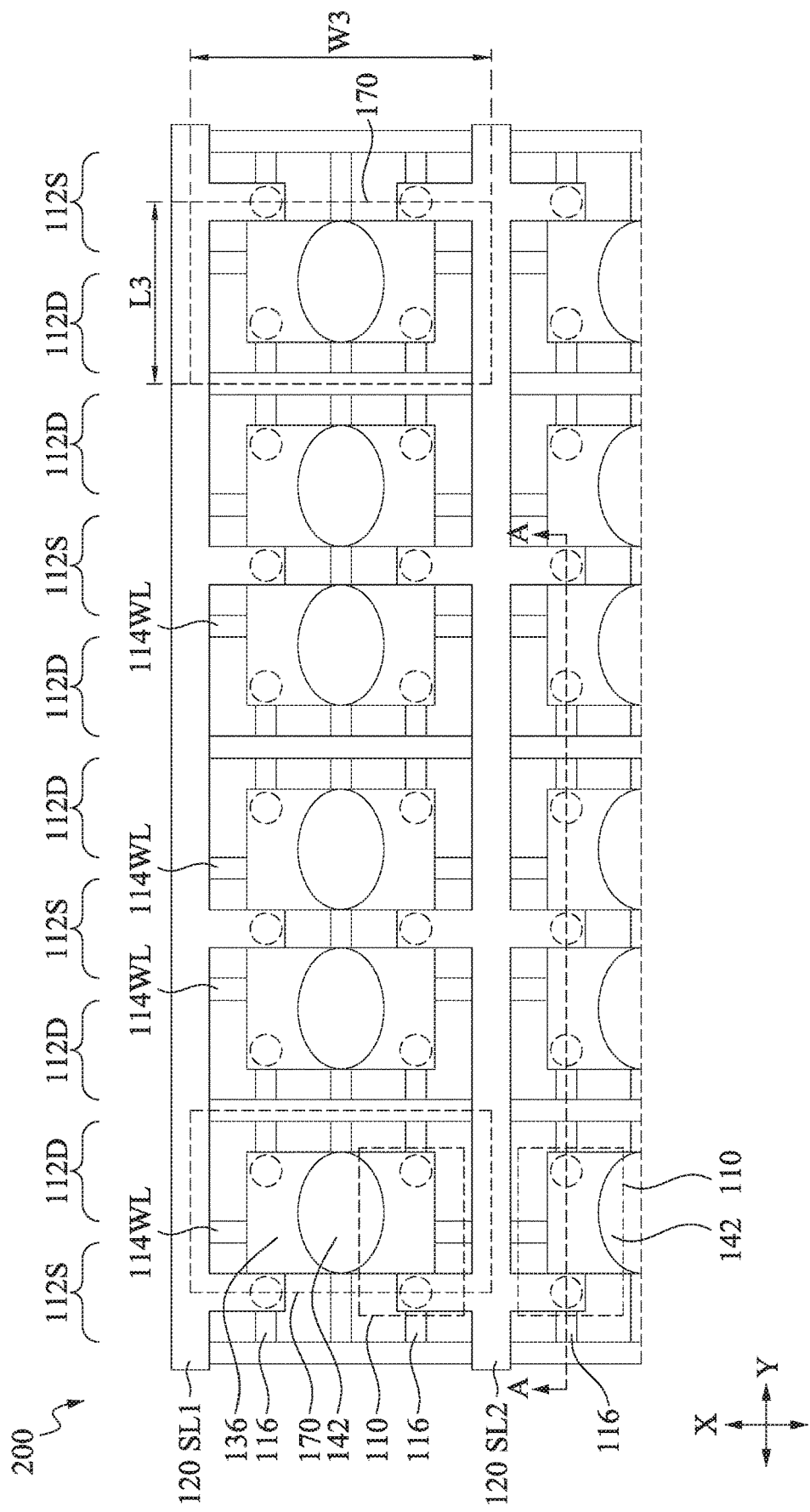

Turning to FIG. 18, a plan view of an SOT-MRAM device 200 having cells 170 is shown, in accordance with some embodiments. For clarity, some features of the SOT-MRAM device 200 are not shown in FIG. 18. The plan view shown in FIG. 18 is similar to that shown in FIG. 11B for the SOT-MRAM device 100, except that the layout of the routing (e.g., conductive lines 120), the fins 116, the gate structures 114, and the SOT-MRAM structures 150 of the SOT-MRAM device 200 have a different configuration than the SOT-MRAM device 100. Also note that the x-axis and y-axis shown in FIG. 18 is rotated 90 degrees with respect to the x-axis and y-axis shown in FIG. 11B.

Each cell 170 of the SOT-MRAM device 200 includes two transistors 110 and operates in a similar manner as described for the SOT-MRAM device 100. However, during the writing operation of cells 170, the current flows through the SOT layer 136 in a direction approximately parallel to the y-axis. In the SOT-MRAM device 200 shown in FIG. 18, the cells 170 may have a smaller lateral area than the cells 160 of the SOT-MRAM device 100. In some embodiments, a cell 170 may be formed having a length L3 that is between about 40 nm and about 300 nm, such as about 112 nm, and a width W3 that is between about 40 nm and about 300 nm. In some embodiments, a cell 170 comprises portions of two adjacent gate structures 114 and the length L3 of a cell 170 is at least partially determined by the spacing between the gate structures 114. For example, the length L3 of a cell 170 may be about one and a half times the spacing between adjacent gate structures 114. In some embodiments, a cell 170 comprises portions of five adjacent fins 116 and the width W3 of a cell 170 is at least partially determined by the spacing between the fins 116. For example, the width W3 of a cell 170 may be about four times the spacing between adjacent fins 116. The SOT-MRAM device 200 shown in FIG. 18 is an example, and other SOT-MRAM devices having other configurations or layouts are within the scope of this disclosure.

The embodiments of the present disclosure have some advantageous features. By forming a cell of a SOT-MRAM device using two transistors as described, the size of the cell may be reduced. For example, because the SOT layer is formed below the MTJ stack and connected to the transistors, additional vias do not need to be formed adjacent the MTJ stack to connect to an overlying SOT layer. The process used to form cells as described herein may have better uniformity and reliability than processes in which the SOT layer is formed above the MTJ stack. In some cases, the required minimum distance between the MTJ stack and an adjacent via may result in a larger cell size, which the embodiments described herein avoid. By combining the reading and writing Word Lines into a single Word Line used for both reading and writing operations, the size of the cell and the amount of routing may be reduced. Additionally, only a single Reading Bit Line (RBL) is used instead of a separate Reading Bit Line and Writing Bit Line, which reduces routing and reduces device size. The reduced routing can improve operation speed and also reduce power consumption. Additionally, the number of masks used to form the SOT-MRAM device may be reduced. In some cases, the process described herein may form an SOT-MRAM device that is thinner or has a smaller size.

In an embodiment, a device includes a first transistor and a second transistor on a substrate, wherein the first transistor includes a first gate structure, a first drain region, and a first source region, and wherein the second transistor includes a second gate structure, a second drain region, and a second source region; a first bottom electrode and a second bottom electrode over the first transistor and the second transistor, wherein the first bottom electrode is electrically coupled to the first drain region and the second bottom electrode is electrically coupled to the second drain region; a Spin Orbit Torque (SOT) layer over the first bottom electrode and the second bottom electrode, wherein the SOT layer is electrically coupled to the first bottom electrode and the second bottom electrode; a Magnetic Tunnel Junction (MTJ) stack over and electrically coupled to the SOT layer; and a top electrode over and electrically coupled to the MTJ stack. In an embodiment, the first transistor includes a first FinFET and the second transistor includes a second FinFET. In an embodiment, the SOT layer extends laterally from the first bottom electrode to the second bottom electrode in a first direction, and the MTJ stack has a longest lateral dimension in a second direction perpendicular to the first direction. In an embodiment, the SOT layer extends laterally from the first bottom electrode to the second bottom electrode in a first direction, and the MTJ stack has a longest lateral dimension in the first direction. In an embodiment, the device includes a first Word Line electrically coupled to the first gate structure and a second Word Line electrically coupled to the second gate structure. In an embodiment, the first Word Line is electrically coupled to the second Word Line. In an embodiment, the device includes a first Source Line over and electrically coupled to the first drain and a second Source Line over and electrically coupled to the second drain. In an embodiment, the MTJ stack includes a ferromagnetic free layer, a barrier layer over the ferromagnetic free layer, a ferromagnetic reference layer over the barrier layer, and a Synthetic Anti-Ferromagnetic layer over the ferromagnetic reference layer.

In an embodiment, a device includes a substrate; Magneto-Resistive Random Access Memory (MRAM) cells on the substrate, wherein each MRAM cell includes a first conductive feature and a second conductive feature within a dielectric layer; a Spin Orbit Torque (SOT) layer extending over the first conductive feature and the second conductive feature, wherein the SOT layer is electrically coupled to the first conductive feature and the second conductive feature; a Magnetic Tunnel Junction (MTJ) stack over and electrically coupled to the SOT layer; and a top electrode over and electrically coupled to the MTJ stack; and a third conductive feature extending over a first MRAM cell of the MRAM cells and a second MRAM cell of the MRAM cells, wherein the third conductive feature is electrically coupled to the top electrode of the first MRAM cell and the top electrode of the second MRAM cell. In an embodiment, the device includes a first FinFET and a second FinFET on the substrate, wherein the first conductive feature is electrically coupled to the first FinFET and the second conductive feature is electrically coupled to the second FinFET. In an embodiment, the device includes a dummy FinFET laterally disposed between the first FinFET and the second FinFET. In an embodiment, each MRAM cell has an area between 500 nm² and 60000 nm². In an embodiment, the MTJ stack includes a free layer and a reference layer, wherein the SOT layer is disposed between the reference layer and the substrate. In an embodiment, the MTJ stack has a lateral area that is less than the lateral area of the SOT layer. In an embodiment, the MTJ stack is laterally disposed between the first conductive feature and the second conductive feature.

In an embodiment, a method includes depositing a first dielectric layer over a semiconductor substrate; depositing a first electrode layer over the first dielectric layer; etching the first electrode layer to form a first electrode and a second electrode laterally separated from the first electrode; depositing a Spin Orbit Torque (SOT) material on the first electrode and the second electrode; depositing Magnetic Tunnel Junction (MTJ) layers on the SOT material; depositing a second electrode layer on the MTJ layers; etching the SOT material to form a SOT layer extending from the first electrode to the second electrode; etching the MTJ layers to form an MTJ stack on the SOT layer; and etching the second electrode layer to form a top electrode on the MTJ stack. In an embodiment, the method includes forming a first FinFET and a second FinFET in the semiconductor substrate. In an embodiment, the method includes forming first conductive lines over the substrate, wherein the first electrode and the second electrode are electrically coupled to the first conductive lines. In an embodiment, the method includes forming second conductive lines over the MTJ stack, wherein a second conductive line is electrically coupled to the top electrode. In an embodiment, the second conductive lines have a greater linewidth than the first conductive lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first transistor and a second transistor on a substrate, wherein the first transistor comprises a first gate structure, a first drain region, and a first source region, and wherein the second transistor comprises a second gate structure, a second drain region, and a second source region;
    a dummy transistor on the substrate, wherein the dummy transistor comprises a dummy gate structure, wherein the dummy transistor is laterally between the first transistor and the second transistor;
    a first bottom electrode and a second bottom electrode over the first transistor and the second transistor, wherein the first bottom electrode is electrically coupled to the first drain region and the second bottom electrode is electrically coupled to the second drain region;
    a Spin Orbit Torque (SOT) layer over the first bottom electrode and the second bottom electrode, wherein the SOT layer is electrically coupled to the first bottom electrode and the second bottom electrode;
    a Magnetic Tunnel Junction (MTJ) stack over and electrically coupled to the SOT layer; and
    a top electrode over and electrically coupled to the MTJ stack.

2. The device of claim 1, wherein the first transistor comprises a first FinFET and the second transistor comprises a second FinFET.

3. The device of claim 1, wherein the SOT layer extends laterally from the first bottom electrode to the second bottom electrode in a first direction, and wherein the MTJ stack has a longest lateral dimension in a second direction perpendicular to the first direction.

4. The device of claim 1, wherein the SOT layer extends laterally from the first bottom electrode to the second bottom electrode in a first direction, and wherein the MTJ stack has a longest lateral dimension in the first direction.

5. The device of claim 1, further comprising a first Word Line electrically coupled to the first gate structure and a second Word Line electrically coupled to the second gate structure.

6. The device of claim 5, wherein the first Word Line is electrically coupled to the second Word Line.

7. The device of claim 1, further comprising a first Source Line over and electrically coupled to the first drain region and a second Source Line over and electrically coupled to the second drain region.

8. The device of claim 1, wherein the MTJ stack comprises a ferromagnetic free layer, a barrier layer over the ferromagnetic free layer, a ferromagnetic reference layer over the barrier layer, and a Synthetic Anti-Ferromagnetic layer over the ferromagnetic reference layer.

9. A device comprising:
    a substrate;
    a plurality of Magneto-Resistive Random Access Memory (MRAM) cells on the substrate, wherein each MRAM cell of the plurality of MRAM cells comprises:
    a first conductive feature and a second conductive feature within a dielectric layer, wherein the first conductive feature and the second conductive feature are separated in a first direction;
    a Spin Orbit Torque (SOT) layer extending in the first direction from over the first conductive feature to over the second conductive feature, wherein the SOT layer is electrically coupled to the first conductive feature and the second conductive feature;
    a Magnetic Tunnel Junction (MTJ) stack over and electrically coupled to the SOT layer; and
    a top electrode over and electrically coupled to the MTJ stack; and
    a third conductive feature extending in a second direction from over a first MRAM cell of the plurality of MRAM cells to over a second MRAM cell of the plurality of MRAM cells, wherein the third conductive feature is electrically coupled to the top electrode of the first MRAM cell and the top electrode of the second MRAM cell, wherein the second direction is orthogonal to the first direction.

10. The device of claim 9, further comprising a first FinFET and a second FinFET on the substrate, wherein the first conductive feature is electrically coupled to the first FinFET and the second conductive feature is electrically coupled to the second FinFET.

11. The device of claim 10, further comprising a dummy FinFET laterally disposed between the first FinFET and the second FinFET.

12. The device of claim 9, wherein each MRAM cell of the plurality of MRAM cells has an area between 500 nm$^2$ and 60000 nm$^2$.

13. The device of claim 9, wherein the MTJ stack comprises a free layer and a reference layer, wherein the SOT layer is disposed between the reference layer and the substrate.

14. The device of claim 9, wherein the MTJ stack has a lateral area that is less than the lateral area of the SOT layer.

15. The device of claim 9, wherein the MTJ stack is laterally disposed between the first conductive feature and the second conductive feature.

16. A device comprising:
   a fin extending on a semiconductor substrate;
   a gate structure extending on a top surface of the fin;
   a first dielectric layer over the semiconductor substrate;
   a first electrode and a second electrode over the first dielectric layer, wherein the second electrode is laterally separated from the first electrode, wherein the first electrode is vertically over the fin and the second electrode is vertically over the fin;
   a layer of Spin Orbit Torque (SOT) material on the first electrode and the second electrode, wherein the layer of SOT material extends from the first electrode to the second electrode, wherein the SOT material extending from the first electrode to the second electrode has a uniform thickness;
   a plurality of Magnetic Tunnel Junction (MTJ) layers on the layer of SOT material, wherein the MTJ layers extend over the gate structure; and
   a top electrode on the plurality of MTJ layers.

17. The device of claim 16 further comprising a first FinFET and a second FinFET on the semiconductor substrate, the first FinFET comprising a first portion of the fin and the second FinFET comprising a second portion of the fin, wherein the first electrode is coupled to the first FinFET and the second electrode is coupled to the second FinFET.

18. The device of claim 16 further comprising a plurality of first conductive lines over the semiconductor substrate, wherein the first electrode and the second electrode are electrically coupled to the plurality of first conductive lines.

19. The device of claim 18 further comprising a plurality of second conductive lines over the plurality of MTJ layers, wherein a second conductive line of the plurality of second conductive lines is electrically coupled to the top electrode.

20. The device of claim 19, wherein the plurality of second conductive lines has a greater linewidth than the plurality of first conductive lines.

* * * * *